(12) United States Patent
Kim et al.

(10) Patent No.: US 11,428,753 B2
(45) Date of Patent: *Aug. 30, 2022

(54) METHOD FOR DETECTING WATER IN CONNECTION TERMINAL OF ELECTRONIC DEVICE AND ELECTRONIC DEVICE SUPPORTING THE SAME

(71) Applicant: Samsung Electronics Co., Ltd, Suwon-si (KR)

(72) Inventors: Kyoungwon Kim, Suwon-si (KR); Wonseok Kang, Suwon-si (KR); Sejong Park, Suwon-si (KR); Jaehyun Ahn, Suwon-si (KR); Kwangyeol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

This patent is subject to a terminal disclaimer.

(21) Appl. No.: 16/660,654

(22) Filed: Oct. 22, 2019

(65) Prior Publication Data

US 2020/0124655 A1    Apr. 23, 2020

(30) Foreign Application Priority Data

Oct. 22, 2018   (KR) .................. 10-2018-0125749

(51) Int. Cl.
| | | |
|---|---|---|
| *G01R 31/69* | (2020.01) | |
| *G01R 27/26* | (2006.01) | |
| *G08B 21/18* | (2006.01) | |
| *G08B 5/22* | (2006.01) | |

(52) U.S. Cl.
CPC .......... *G01R 31/69* (2020.01); *G01R 27/2605* (2013.01); *G08B 5/22* (2013.01); *G08B 21/182* (2013.01); *G08B 21/185* (2013.01)

(58) Field of Classification Search
CPC ..... G01M 3/16; G01R 27/2605; G01R 31/69; G08B 21/182; G08B 21/185; G08B 5/22
See application file for complete search history.

(56) References Cited

U.S. PATENT DOCUMENTS

| | | | |
|---|---|---|---|
| 11,079,347 B1 * | 8/2021 | Beasley | ............... G01N 27/223 |
| 2009/0219037 A1 | 9/2009 | Campbell | |

(Continued)

FOREIGN PATENT DOCUMENTS

| | | |
|---|---|---|
| JP | 5243874 B2 | 7/2013 |
| KR | 10-2014-0005747 A | 1/2014 |

(Continued)

OTHER PUBLICATIONS

ISA/KR, International Search Report and Written Opinion of the International Searching Authority, International Application No. PCT/KR2019/013895, dated Feb. 7, 2020, 9 pages.

*Primary Examiner* — Omer S Khan

(57) ABSTRACT

An electronic device according to various embodiments of the disclosure includes a connection terminal including a terminal; a controller configured to identify a resistance value of the terminal; a capacitance checker configured to identify capacitance of the terminal; and a processor configured to determine whether or not water is present in the at least one terminal based on information related to the resistance value received from the controller and the capacitance received from the capacitance checker.

12 Claims, 12 Drawing Sheets

(56) References Cited

U.S. PATENT DOCUMENTS

| | | | | |
|---|---|---|---|---|
| 2014/0313039 A1* | 10/2014 | Stevens | ................. | H03K 17/94 340/604 |
| 2016/0313270 A1 | 10/2016 | Connell et al. | | |
| 2019/0060136 A1* | 2/2019 | Turner | ................. | A01K 29/005 |
| 2019/0064998 A1* | 2/2019 | Chowdhury | ........ | G06F 3/04144 |

FOREIGN PATENT DOCUMENTS

| | | |
|---|---|---|
| KR | 101438731 B1 | 9/2014 |
| KR | 10-2018-0019407 A | 2/2018 |

\* cited by examiner

METHOD FOR DETECTING WATER IN CONNECTION TERMINAL OF ELECTRONIC DEVICE AND ELECTRONIC DEVICE SUPPORTING THE SAME

CROSS-REFERENCE TO RELATED APPLICATION

This application is based on and claims priority under 35 U.S.C. 119 to Korean Patent Application No. 10-2018-0125749 filed on Oct. 22, 2018 in the Korean Intellectual Property Office, the disclosure of which is herein incorporated by reference in its entirety.

BACKGROUND

1. Field

Various embodiments of the disclosure relate to a method of detecting water in a connection terminal of an electronic device and an electronic device supporting the same.

2. Description of Related Art

Electronic devices provide a wired interface such as a universal serial bus (USB) for transmitting power or data.

If an electronic device operates (e.g., if a charging operation is performed) in the state in which water is present in a connection terminal of the electronic device, the electronic device may be damaged (e.g., circuit damage, corrosion, etc.) or may malfunction.

The electronic device may perform an operation of determining whether or not water is present in the connection terminal. If it is determined that water is present in the connection terminal, the electronic device may perform an operation of determining whether or not water present in the connection terminal has been removed.

The above information is presented as background information only to assist with an understanding of the disclosure. No determination has been made, and no assertion is made, as to whether or not any of the above might be applicable as prior art with regard to the disclosure.

SUMMARY

Some electronic devices can determine whether or not water is present in a connection terminal and whether or not water present in the connection terminal has been removed using a resistance value of the connection terminal.

If an electronic device performs an operation of determining whether or not water is present and whether or not water has been removed using only a resistance value of the connection terminal, the electronic device may recognize that there is water in the connection terminal even if there is foreign matter therein.

Various embodiments of the disclosure relate to a method of detecting water in a connection terminal of an electronic device, which makes it possible to more accurately detect whether or not water is present in the connection terminal and whether or not water has been removed therefrom by determining whether or not there is water in the connection terminal and whether or not water present in the connection terminal has been removed using a resistance value of the connection terminal and a capacitance value of the connection terminal, and further relate to an electronic device supporting the same.

The technical subjects pursued in the disclosure may not be limited to the above mentioned technical subjects, and other technical subjects which are not mentioned may be clearly understood, through the following descriptions, by those skilled in the art of the disclosure.

An electronic device according to various embodiments may include: a connection terminal including at least one terminal; a controller configured to identify a resistance value of the at least one terminal; a capacitance checker configured to identify capacitance of the at least one terminal; and a processor, wherein the processor may be configured to determine whether or not water is present in the at least one terminal, based at least in part on information related to the resistance value received from the controller and the capacitance received from the capacitance checker.

An electronic device according to various embodiments may include: a connection terminal including at least one terminal; a capacitance checker configured to identify capacitance of the at least one terminal; and a controller, wherein the controller may be configured to: identify a resistance value of the at least one terminal; and determine whether or not water is present in the at least one terminal, based at least in part on information related to the resistance value and the capacitance received from the capacitance checker.

A method according to various embodiments may include: if a processor of an electronic device switches from an inactive state to an active state while the electronic device senses the dry state of at least one terminal included in a connection terminal, determining whether or not a first time configured in a timer of the electronic device has elapsed; if it is determined that the first time has elapsed, determining whether or not water is present in the at least one terminal by a controller of the electronic device; and if it is determined that water is present in the at least one terminal, configuring the timer with a second time, which is different from the first time, by the processor.

Various embodiments of the disclosure make it possible to more accurately detect whether or not water is present in the connection terminal and whether or not water has been removed therefrom by checking whether or not there is water in the connection terminal and whether or not water present in the connection terminal has been removed using a resistance value of the connection terminal and a capacitance value of the connection terminal.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
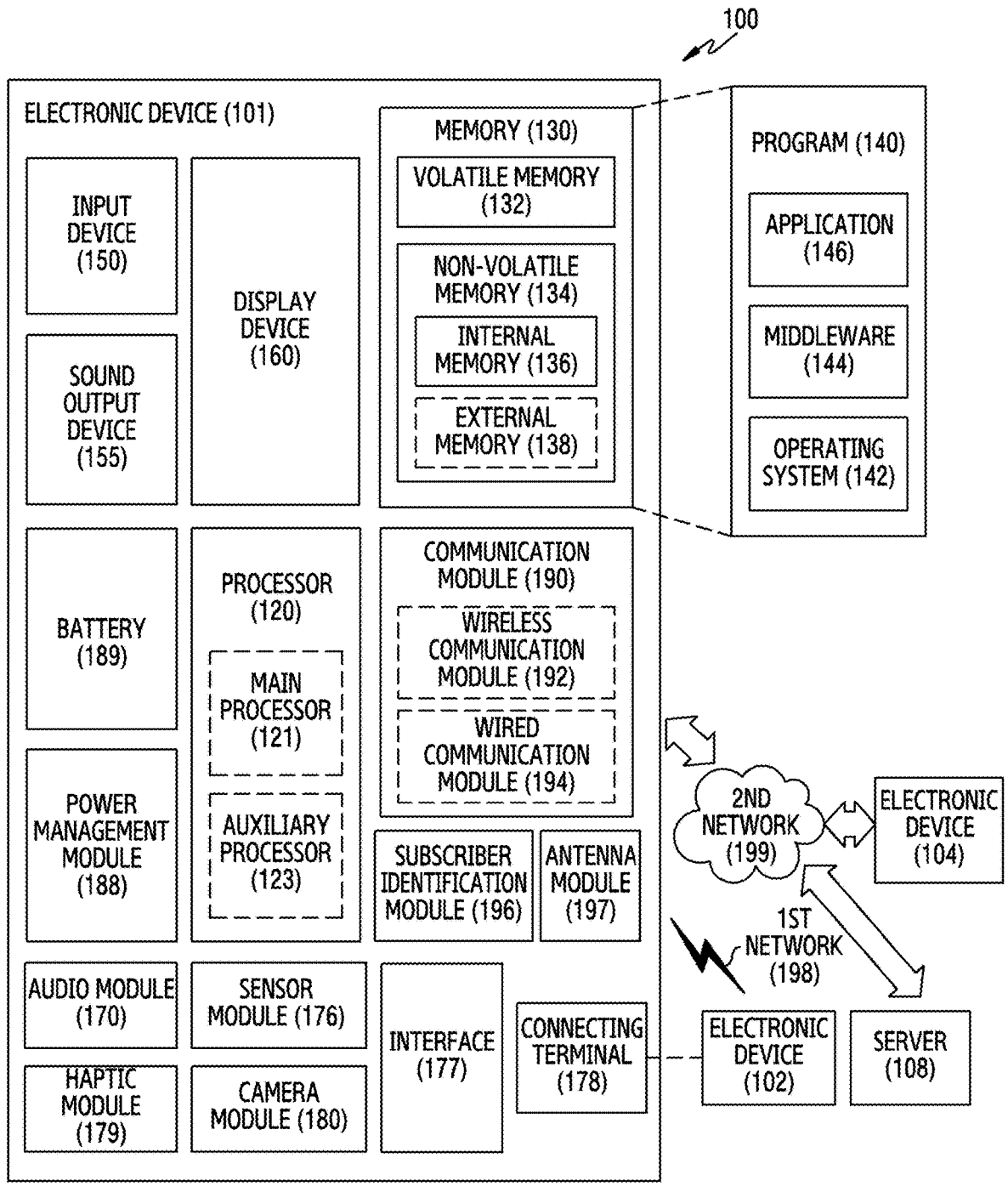
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The non-volatile memory 134 can include an internal memory 136 and an external memory 138. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
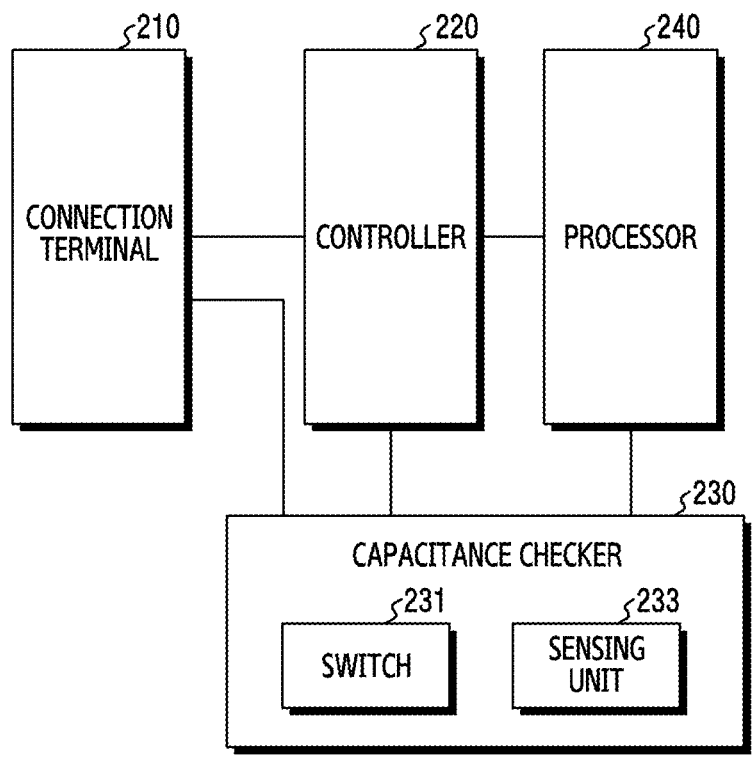
FIG. 2 is a diagram illustrating an electronic device for detecting water in a connection terminal according to various embodiments.

FIG. 2 is a diagram illustrating an electronic device 101 for detecting water in a connection terminal 210 according to various embodiments.

In an embodiment, the electronic device 101 may perform an operation of determining whether or not water is present in the connection terminal 210 (hereinafter, referred to as a "water sensing operation") and an operation of determining whether or not water present in the connection terminal 210 has been removed (hereinafter, referred to as a "dryness sensing operation").

Referring to FIG. 2, in an embodiment, the electronic device 101 may include a connection terminal 210, a controller 220, a capacitance checker 230, and a processor 240.

In an embodiment, the connection terminal 210 may include a USB connector (or a USB receptacle). In an embodiment, the USB connector may include a plurality of terminals (or pins). In an embodiment, the USB connector may be any of various types of USB connectors. For example, the USB connector may be USB type A, USB type B, USB type C, or the like. However, the USB connector is not limited to the types mentioned above. In an embodiment, the USB connector may have any of various specifications. For example, the USB connector may be implemented as USB 2.0 Type C or USB 3.1 Type C. However, the USB connector is not limited to the specifications mentioned above.

Hereinafter, a description will be made assuming that the connection terminal 210 is a USB 3.1 type C connector, but the disclosure is not limited thereto.

In an embodiment, at least one terminal included in the connection terminal 210 (hereinafter, this will be used interchangeably with "at least one terminal") may be used in a water sensing operation or a dryness sensing operation. For example, at least one of a configuration channel terminal (or pin) or a sideband use (SBU) terminal included in the connection terminal 210 may be used in a water sensing operation or a dryness sensing operation (or may be configured to be used in a water sensing operation or a dryness sensing operation).

In an embodiment, at least one terminal may be used in an operation of identifying a resistance value (or a resistance component), which is performed by the controller 220. In an embodiment, at least one terminal may be used in an operation of identifying capacitance (or a capacitance value), which is performed by the capacitance checker 230.

In an embodiment, among a plurality of terminals included in the connection terminal 210, at least one terminal used in the operation of identifying a resistance value, which is performed by the controller 220, may be the same as at least one terminal used in the operation of identifying capacitance, which is performed by the capacitance checker 230. For example, at least one of a CC terminal or an SBU terminal, among the plurality of terminals included in the connection terminal 210, may be used in the operation of identifying a resistance value, which is performed by the controller 220, and in the operation of identifying capacitance, which is performed by the capacitance checker 230.

In an embodiment, among the plurality of terminals included in the connection terminal 210, at least one terminal used in the operation of identifying a resistance value, which is performed by the controller 220, may be different from at least one terminal used in the operation of identifying capacitance, which is performed by the capacitance checker 230. For example, at least one of a CC terminal or an SBU terminal, among the plurality of terminals included in the connection terminal 210, may be used in the operation of identifying a resistance value, which is performed by the controller 220, and a ground (GND) terminal among the plurality of terminals included in the connection terminal 210 may be used in the operation of identifying capacitance, which is performed by the capacitance checker 230.

In an embodiment, the connection terminal 210 may be included in the connection terminal 178 shown in FIG. 1.

In an embodiment, the controller 220 may detect connection or disconnection between the connection terminal 210 and an external electronic device (e.g., the electronic device 102), the type of an external electronic device (e.g., the electronic device 102) connected to the connection terminal 210, an operation mode of the electronic device 101 {for example, whether the electronic device 101 operates as a downstream facing port (DFP), an upstream facing port (UFP), or a dual role port (DRP)}, or the like. For example, the controller 220 may determine connection or disconnection between the connection terminal 210 and an external electronic device (e.g., the electronic device 102) by means of a CC signal received through a CC terminal.

In an embodiment, the controller 220 may perform part of the water sensing operation or part of the dryness sensing operation.

In an embodiment, the controller 220 may identify a resistance value of at least one terminal included in the connection terminal 210. For example, the controller 220 may identify a voltage value (or a voltage level) applied to a pull-down resistor (Rd) connected to at least one terminal included in the connection terminal 210.

In an embodiment, the controller 220 may convert an analog resistance value of at least one terminal into a digital resistance value. In an embodiment, the controller 220 may include an analog-to-digital converter (ADC) for converting an analog resistance value of at least one terminal into a digital resistance value.

In an embodiment, the controller 220 may compare a resistance value of at least one terminal (or a digital resistance value of at least one terminal) with a specified first threshold value. In an embodiment, according to a result of comparing a resistance value of at least one terminal with a specified first threshold value, the controller 220 may transmit, to the processor 240, information indicating that a resistance value of at least one terminal is less than or equal to a specified first threshold value or information indicating that a resistance value of at least one terminal exceeds a specified first threshold value. Hereinafter, the information indicating that a resistance value of at least one terminal is less than or equal to a specified first threshold value or information indicating that a resistance value of at least one terminal exceeds a specified first threshold value will be referred to as "resistance-value-related information".

In an embodiment, as a result of comparing the resistance value of at least one terminal with a specified first threshold value, if it is determined that the resistance value of at least one terminal is less than or equal to the specified first threshold value, the controller 220 may transmit, to the processor 240, information indicating that the resistance value of at least one terminal is less than or equal to the specified first threshold value. For example, if it is determined that the resistance value of at least one terminal is less than or equal to the specified first threshold value, the controller 220 may transmit, to the processor 240, a bit value "1" of a register (or a flag) (or information indicating that a resistance value of at least one terminal corresponds to a high level) (or the controller 220 may configure a register bit value as "1"). In an embodiment, if there is water or conductive foreign matter (or foreign matter resulting from corrosion) (e.g., iron powder, graphite powder, etc.) in at least one terminal, the resistance value of at least one terminal may be less than or equal to a specified first threshold value. In an embodiment, if it is determined that a resistance value of at least one terminal exceeds a specified first threshold value, the controller 220 may transmit, to the processor 240, information indicating that the resistance value of at least one terminal exceeds the specified first threshold value. For example, if it is determined that a resistance value of at least one terminal exceeds a specified first threshold value, the controller 220 may transmit a register bit value "0" to the processor 240 (or may configure a register bit value as "0"). In an embodiment, if no water is present in at least one terminal (or if there is a specified amount of water or less, or if at least one terminal is in a dry state), or if a circuit of the electronic device 101 is damaged {e.g., damage to a chip, damage to a transient-voltage-suppression (TVS) diode, etc.}, a resistance value of at least one terminal may exceed a specified first threshold value.

In an embodiment, if it is determined that all resistance values of a plurality of terminals are less than or equal to a specified first threshold value, the controller 220 may transmit, to the processor 240, information indicating that the resistance values are less than or equal to the specified first threshold value, and if it is determined that at least one of the resistance values of a plurality of terminals exceeds a specified first threshold value, the controller 220 may transmit, to the processor 240, information indicating that the resistance value exceeds the specified first threshold value. However, the disclosure is not limited thereto. For example, if it is determined that at least one of the resistance values of a plurality of terminals is less than or equal to a specified first threshold value, the controller 220 may transmit, to the processor 240, information indicating that the resistance value is less than or equal to the specified first threshold value, and if it is determined that all resistance values of the plurality of terminals exceed a specified first threshold value, the controller 220 may transmit, to the processor 240, information indicating that the resistance values exceed the specified first threshold value.

In an embodiment, the controller 220 may identify resistance values of a plurality of terminals in sequence. For example, the controller 220 may identify a resistance value of a first terminal (e.g., the SBU terminal) among a plurality of terminals, and may identify a resistance value of a second terminal (e.g., the CC terminal) after a specified delay time. However, the disclosure is not limited thereto. For example, the controller 220 may simultaneously identify the resistance values of a plurality of terminals.

In an embodiment, if the controller 220 sequentially identifies the resistance values of a plurality of terminals, the controller 220 may identify the resistance values of the plurality of terminals in a specified order. For example, the controller 220 may identify the resistance value of an SBU terminal prior to the resistance value of a CC terminal in consideration of the fact that the number of functions performed through the SBU terminal (e.g., transmitting/receiving audio signals) is less than the number functions performed through the CC1 terminal or CC2 terminal {e.g., detecting a connection between the electronic device 101 and an external electronic device (e.g., the electronic device 102), determining the type of the external electronic device (e.g., the electronic device 102) connected to the electronic device 101, determining the operation mode of the electronic device 101, and the like}. However, the method of determining the order of identifying the resistance values between the plurality of terminals is not limited thereto.

In an embodiment, the controller 220 may release (or open) the connection with at least one terminal after performing part of the water sensing operation or dryness sensing operation (e.g., an operation of identifying a resistance value of at least one terminal or an operation of determining whether or not a resistance value of at least one terminal is less than or equal to a first threshold value). In an embodiment, the controller 220 may control capacitance checker 230, which is not in connection with the connection terminal 210 (or at least one terminal), so as to be connected to the connection terminal 210 after disconnecting from at least one terminal (or at the same time as disconnection of the controller 220 from at least one terminal). In an embodiment, the controller 220 may transmit, to the capacitance checker 230, a control signal for causing the capacitance checker 230 to switch from an inactive state to an active state. In an embodiment, if the capacitance checker 230 completes an operation related to the capacitance generated in at least one terminal, the controller 220 may transmit, to the capacitance checker 230, a control signal for causing the capacitance checker 230 to switch from an active state to an inactive state.

In an embodiment, the controller 220 may include a CC controller 220 {or a power delivery (PD) controller 220}.

In an embodiment, the controller 220 may be included in the interface 177 shown in FIG. 1.

In an embodiment, the capacitance checker 230 may perform part of the water sensing operation or part of the dryness sensing operation.

In an embodiment, the capacitance checker 230 may include a switch 231 and a sensing unit 233.

In an embodiment, the switch 231 may switch from an inactive state to an active state in response to the reception of a control signal from the controller 220. For example, the switch 231 may switch from a Hi-Z (or high impedance) state (or an open state) to a state of being connected with (or shorted to) at least one of a plurality of terminals of the connection terminal 210 in response to the reception of a control signal from the controller 220.

In an embodiment, the switch 231 may perform a switching operation such that one or more of a plurality of terminals of the connection terminal 210 and the sensing unit 233 are sequentially connected with each other. For example, in the state in which a first terminal, among a first terminal and a second terminal used (or configured) to perform a water sensing operation or a dryness sensing operation, is connected to the sensing unit 233, after the sensing unit 233 identifies the capacitance generated in the first terminal or after performing an operation of determining whether or not the capacitance generated in the first terminal is equal to or greater than a specified second threshold value, the switch 231 may perform a switching operation such that the sensing unit 233 disconnects from the first terminal and connects to the second terminal. A more detailed description will be made later with reference to FIG. 3.

In an embodiment, the switch 231 may include a multiplexer (MUX) switch.

In an embodiment, the sensing unit 233 may sense (or detect) capacitance (or a capacitance value or the amount of change in capacitance) generated in at least one terminal.

In an embodiment, the sensing unit 233 may sense the capacitance generated in at least one terminal by a self-capacitance method. In an embodiment, the sensing unit 233 may include a sensor (e.g., a grip sensor, a touch-key sensor, etc.) for sensing capacitance (or a change in capacitance) using a self-capacitance method. In an embodiment, a sensor for sensing capacitance by a self-capacitance method may sense a larger capacitance value (or an increased capacitance value) in the case where there is water in at least one terminal, compared to the case where no water is in at least one terminal. In an embodiment, a sensor for sensing capacitance by a self-capacitance method may sense a larger capacitance value in the case where a circuit is damaged, compared to the case where the circuit is not damaged. In an embodiment, a sensor for sensing capacitance by a self-capacitance method may sense the capacitance of a ground (GND) terminal or a latch terminal of a plurality of terminals of the connection terminal 210. In an embodiment, the latch terminal may be a terminal (or lead) disposed on at least one of the sides of GND terminals (e.g., pin A1, pin A12, pin B1, or pin B12) of a USB type C connector.

In an embodiment, the sensing unit 233 may sense capacitance that changes with the dielectric constant of a dielectric (or medium) inside at least one terminal. In an embodiment, if there is water in at least one terminal, which has a higher dielectric constant than air, a larger capacitance value may be sensed, compared to the case where at least one terminal is filled with air therein. In an embodiment, if a circuit is damaged, the distance between the electrodes producing the capacitance is reduced. In this case, a larger capacitance value may be sensed, compared to the case where the circuit is not damaged. In an embodiment, the sensing unit 233 may include a sensor for sensing capacitance that changes depending on the dielectric constant of a dielectric.

In an embodiment, the sensing unit 233 may sense capacitance using at least one terminal among all terminals included in the connection terminal 210, regardless of the type of terminal.

In an embodiment, the sensing unit 233 may include an ADC for converting a sensed analog capacitance value to a digital capacitance value.

In an embodiment, the sensing unit 233 may compare the capacitance (or the amount of change in capacitance) of at least one terminal (or a digital capacitance value of at least one terminal) with a specified second threshold value. In an embodiment, a second threshold value to be compared with the capacitance of at least one terminal in the water sensing operation (hereinafter, referred to as a "specified 2-$1^{st}$ threshold value") may be configured to be different from a second threshold value to be compared with the capacitance of at least one terminal in the dryness sensing operation (hereinafter, referred to as a "specified 2-$2^{nd}$ threshold value"). In an embodiment, the specified 2-$2^{nd}$ threshold value may be set lower than the specified 2-$1^{st}$ threshold value. For example, the specified 2-$2^{nd}$ threshold value may be set lower than the specified 2-$1^{st}$ threshold value by a value due to (in consideration of) hysteresis. In an embodiment, by setting the specified 2-$2^{nd}$ threshold value to be lower than the specified 2-$1^{st}$ threshold value, it is possible to prevent the result of the dryness sensing operation from being changed frequently because the capacitance of at least one terminal sensed in the dryness sensing operation frequently changes within a specified range exceeding the specified 2-$1^{st}$ threshold value (or a threshold value without consideration of hysteresis) and a specified range less than the specified 2-$1^{st}$ threshold value.

According to an embodiment, the sensing unit 233 may transmit, to the processor 240, information indicating that the capacitance of at least one terminal is greater than or equal to a specified second threshold value or information indicating that the capacitance of at least one terminal is less than a specified second threshold value according to a result of comparing the capacitance of at least one terminal with the specified second threshold value. Hereinafter, the information indicating that the capacitance of at least one terminal is greater than or equal to a specified second threshold value or the information indicating that the capacitance of at least one terminal is less than a specified second threshold value will be referred to as "capacitance-related information".

According to an embodiment, if it is determined that the capacitance of at least one terminal is greater than or equal to a specified second threshold value as a result of comparing the capacitance of at least one terminal with the specified second threshold value, the sensing unit 233 may transmit, to the processor 240, information indicating that the capacitance of at least one terminal is greater than or equal to the specified second threshold value. For example, if it is determined that the capacitance of at least one terminal is greater than or equal to a specified second threshold value, the sensing unit 233 may transmit, to the processor 240, a bit value "1" of a register (or a flag) (or information indicating that a capacitance value of at least one terminal corresponds to a high level) (or may configure a register bit value as "1"). In an embodiment, if it is determined that the capacitance of at least one terminal is less than a specified second threshold value, the sensing unit 233 may transmit, to the processor 240, information indicating that the capacitance of at least one terminal is less than the specified second threshold value. For example, if it is determined that the capacitance of at least one terminal is less than a specified second threshold value, the sensing unit 233 may transmit, to the processor 240, a bit value "0" of a register (or information indicating that a capacitance value of at least one terminal corresponds to a low level) (or may configure a register bit value as "0").

In an embodiment, if it is determined that all capacitance values sensed in a plurality of terminals are greater than or equal to a specified second threshold value, the sensing unit 233 may transmit, to the processor 240, information indicating that the capacitance values are greater than or equal to the specified second threshold value, and if it is determined that at least one of the capacitance values sensed in the plurality of terminals is less than a specified second threshold value, the sensing unit 233 may transmit, to the processor 240, information indicating that the capacitance value is less than the specified second threshold value. However, the disclosure is not limited thereto. For example, if it is determined that at least one of the capacitance values sensed in a plurality of terminals is greater than or equal to a specified second threshold value, the sensing unit 233 may transmit, to the processor 240, information indicating that the capacitance value is greater than or equal to the specified second threshold value, and if it is determined that all capacitance values sensed in the plurality of terminals are less than a specified second threshold value, the sensing unit 233 may transmit, to the processor 240, information indicating that the capacitance values are less than the specified second threshold value.

In an embodiment, the sensing unit 233 may transmit, to the processor 240, the capacitance (or the amount of change in capacitance) of at least one terminal without transmitting the capacitance-related information to the processor. For example, the sensing unit 233 may transmit, to the processor 240, the capacitance sensed in at least one terminal without comparing the capacitance of at least one terminal with the specified second threshold value (or without determining a bit value related to the capacitance).

In an embodiment, in the case where the sensing unit 233 transmits, to the processor 240, the capacitance of at least one terminal without transmitting the capacitance-related information to the processor, the processor 240 may perform an operation of comparing the capacitance of at least one terminal with a specified second threshold value, thereby determining whether or not the capacitance of at least one terminal is greater than or equal to the specified second threshold value. In an embodiment, the processor 240 may configure a register bit value, based on the result of comparing the capacitance of at least one terminal with the specified second threshold value.

In an embodiment, the processor 240 may determine whether or not water is present in at least one terminal, based on the resistance-value-related information received from the controller 220 and the capacitance-related information received from the sensing unit 233.

In an embodiment, if information indicating that the resistance value of at least one terminal is less than or equal to a specified first threshold value is received from the controller 220, and if information indicating that the capacitance of at least one terminal is greater than or equal to a specified second threshold value is received from the sensing unit 233, the processor 240 may determine that water is present in the connection terminal 210.

In an embodiment, if information indicating that the resistance value of at least one terminal is less than or equal to a specified first threshold value is received from the controller 220, and if information indicating that the capacitance of at least one terminal is less than a specified second threshold value is received from the sensing unit 233, the processor 240 may determine that foreign matter is present in the connection terminal 210.

In an embodiment, if information indicating that the resistance value of at least one terminal exceeds a specified first threshold value is received from the controller 220, and if information indicating that the capacitance of at least one terminal is greater than or equal to a specified second threshold value is received from the sensing unit 233, the processor 240 may determine that a circuit of the electronic device 101 has been damaged.

In an embodiment, if information indicating that the resistance value of at least one terminal exceeds a specified first threshold value is received from the controller 220, and if information indicating that the capacitance of at least one terminal is less than a specified second threshold value is received from the sensing unit 233, the processor 240 may determine that no water and foreign matter is present in the connection terminal 210 and that a circuit of the electronic device 101 has not been damaged (or that the connection terminal 210 is in a dry state).

In an embodiment, if it is determined that water is present in the connection terminal 210 through a water sensing operation, the processor 240 may perform a dryness sensing operation.

In an embodiment, at least part of the dryness sensing operation may be the same as or similar to at least part of the water sensing operation.

In an embodiment, the dryness sensing operation may be performed repeatedly. For example, if the processor 240 determines that there is water in the connection terminal 210 in the water sensing operation, the processor 240 may perform control such that the electronic device 101 (e.g., the controller 220) performs a first dryness sensing operation. If the processor 240 determines that there is water in the connection terminal 210 in the first dryness sensing operation, the processor 240 may perform control such that the electronic device 101 (e.g., the controller 220) performs a second dryness sensing operation.

In an embodiment, if the processor 240 determines that there is no water in the connection terminal 210 (e.g., if the processor 240 determines that foreign matter is present in the connection terminal 210, that a circuit of the electronic device 101 has been damaged, or that the connection terminal 210 is in a dry state) in the dryness sensing operation, the processor 240 may terminate the dryness sensing operation.

In an embodiment, if the processor 240 determines that foreign matter is present in the connection terminal 210 in the dryness sensing operation, the processor 240 may perform control such that the electronic device 101 (e.g., the controller 220) performs a water sensing operation. In an embodiment, the processor 240 performs control so as to execute a water sensing operation if the processor 240 determines that foreign matter is present in the connection terminal 210 in the dryness sensing operation, thereby more accurately determining whether or not water is present in the connection terminal 210.

In an embodiment, if the processor 240 determines that a circuit of the electronic device 101 has been damaged in the dryness sensing operation, the processor 240 may perform control such that the electronic device 101 (e.g., the controller 220) performs the dryness sensing operation again. In an embodiment, the processor 240 performs control so as to execute the dryness sensing operation if it is determined that a circuit of the electronic device 101 has been damaged in the dryness sensing operation, thereby more accurately determining whether or not water present in the connection terminal 210 has been removed (or whether or not the circuit has been damaged).

Although not shown in FIG. 2, the electronic device 101 may further include the display device 160 shown in FIG. 1.

In an embodiment, the processor 240 may control the display device 160 so as to display another screen according to whether or not water is present in at least one terminal through the display device after performing the water sensing operation.

In an embodiment, if it is determined that there is water in the connection terminal 210, the processor 240 may control the display device 160 so as to display information indicating that water is present in the connection terminal 210. In an embodiment, if it is determined that there is water in the connection terminal 210, the processor 240 may display, on the display device 160, information indicating that a charging operation is to be performed after the water in the connection terminal 210 is removed.

In an embodiment, if it is determined that foreign matter is present in the connection terminal 210, the processor 240 may display, on the display device 160, information indicating that foreign matter is present in the connection terminal 210. In an embodiment, if it is determined that the foreign matter is present in the connection terminal 210, the processor 240 may display cleaning guidance for removing the foreign matter from the connection terminal 210 through the display device 160. In an embodiment, if it is determined that foreign matter is present in the connection terminal 210, and if a charging adapter is connected to the electronic device 101, the processor 240 may perform an operation of charging the electronic device 101 at a low speed. For example, in an embodiment, if it is determined that foreign matter is present in the connection terminal 210, and if a charging adapter is connected to the electronic device 101, the processor 240 may perform an operation of adjusting a current level (or a voltage level) for charging the electronic device 101 to be lowered.

In an embodiment, if it is determined that a circuit of the electronic device 101 has been damaged, the processor 240 may display, on the display device 160, information indicating that the circuit of the electronic device 101 has been damaged. In an embodiment, if it is determined that a circuit of the electronic device 101 has been damaged, the processor 240 may display, on the display device 160, information asking a user to visit a customer service center.

In an embodiment, if the processor 240 determines that water is still present in the connection terminal 210 after performing the dryness sensing operation, the processor 240 may control the display device 160 so as to maintain the display of information indicating that water is present in the connection terminal 210.

In an embodiment, if the processor 240 determines that no water is present in the connection terminal 210 (or that the connection terminal 210 is in a dry state) after performing the dryness sensing operation, the processor 240 may control the display device 160 such that the information indicating the presence of water in the connection terminal 210 disappears.

Although a threshold value (e.g., the specified first threshold value) to be compared with a resistance value of at least one terminal by the controller 220 and a threshold value (e.g., the specified second threshold value) to be compared with the capacitance of at least one terminal by the sensing unit 233 are configured as a single threshold value, respectively, in the above-described embodiments, the threshold values are not limited thereto. For example, a plurality of threshold values may be compared with the resistance value of at least one terminal by the controller 220 or a plurality of threshold values may be compared with the capacitance of at least one terminal by the sensing unit 233. In an embodiment, a plurality of threshold values may be compared with the resistance value of at least one terminal by the controller 220 or a plurality of threshold values may be compared with the capacitance of at least one terminal by the sensing unit 233. If the controller 220 determines that the resistance value of at least one terminal is less than a threshold value set smaller than a specified first threshold value, and if the sensing unit 233 determines that the capacitance value of at least one terminal is greater than a specified second threshold value, the electronic device 101 may determine that there is a high concentration of saline water in at least one terminal.

In an embodiment, the processor 240 may be included in the processor 120 shown in FIG. 1.

Figure 3:
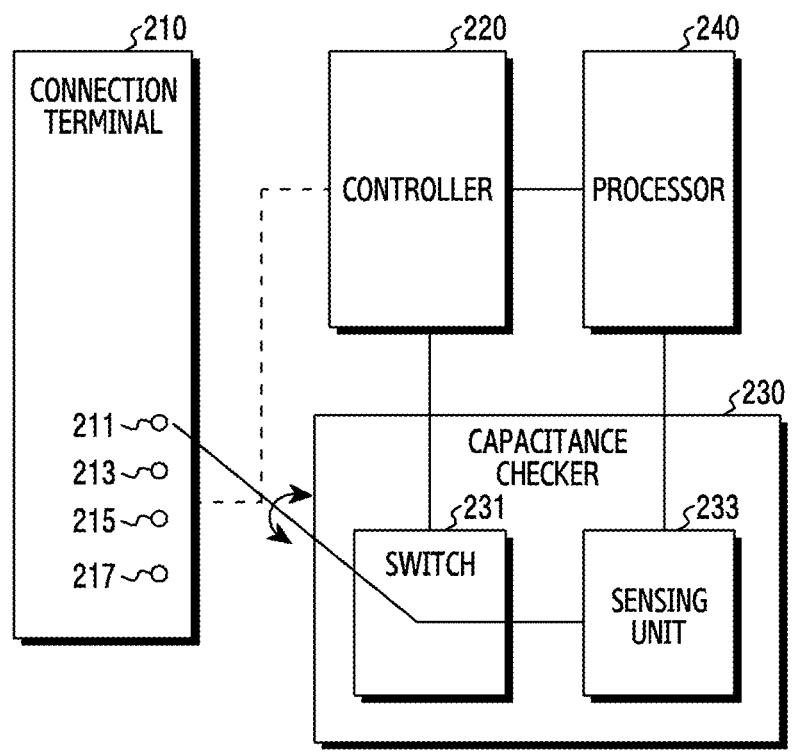
FIG. 3 is a diagram illustrating an operation of a capacitance checker according to various embodiments.

FIG. 3 is a diagram illustrating the operation of a capacitance checker 230 according to various embodiments.

Referring to FIG. 3, in an embodiment, the electronic device 101 may include a connection terminal 210, a controller 220, a capacitance checker 230, and a processor 240.

In an embodiment, a switch 231 may switch from an inactive state to an active state in response to a control signal received from the controller 220. For example, the switch 231 may switch from a Hi-Z state to state of being connected with (or shorted to) at least one of a plurality of terminals of the connection terminal 210 in response to the reception of a control signal from the controller 220. In an embodiment, the controller 220 may transmit, to the switch 231, a control signal for activating the switch 231 after releasing the connection with the connection terminal 210.

In an embodiment, if a control signal is received from the controller 220, the switch 231 may connect to one of a plurality of terminals configured to be used in a water sensing operation or a dryness sensing operation, among the terminals of the connection terminal 210, based at least in part on a specified order. For example, if a control signal is received from the controller 220, the switch 231 may be connected to a first terminal 211 having the highest sequential priority (or specified to be connected prior to other terminals). In an embodiment, a plurality of terminals 211, 213, 215, 217 configured to be used in a water sensing operation or a dryness sensing operation, among the terminals of the connection terminal 210, may include an SBU1 terminal, an SBU2 terminal, a CC1 terminal, and a CC2 terminal. However, the plurality of terminals configured to be used in the water sensing operation or the dryness sensing operation is not limited to the SBU1 terminal, the SBU2 terminal, the CC1 terminal, and the CC2 terminal. For example, at least one of all terminals included in the connection terminal 210 may be configured to be used in the water sensing operation or the dryness sensing operation. In an embodiment, although the plurality of terminals 211, 213, 215, and 217 is illustrated in FIG. 3, the water sensing operation or the dryness sensing operation may be performed using only one terminal. In an embodiment, if the plurality of terminals 211, 213, 215, and 217 configured to be used in the water sensing operation or the dryness sensing operation includes an SBU1 terminal, an SBU2 terminal, a CC1 terminal, and a CC2 terminal, the SBU1 terminal and the SBU2 terminal may be configured to have higher sequential priorities than the CC1 terminal and the CC2 terminal. For example, since the functions performed through the SBU1 terminal or the SBU2 terminal are more numerous than the functions performed through the CC1 terminal or the CC2 terminal, the SBU1 terminal and the SBU2 terminal may be configured to have higher sequential priorities than the CC1 terminal and the CC2 terminal. However, the method of specifying the priorities between the plurality of terminals is not limited thereto.

In an embodiment, if the switch 231 is connected to a first terminal 211, the sensing unit 233 may identify (or sense) the capacitance of the first terminal 211. In an embodiment, the sensing unit 233 may determine whether or not the capacitance of the first terminal 211 is greater than or equal to a specified second threshold value by comparing the capacitance of the first terminal 211 with the specified second threshold value.

In an embodiment, the switch 231 may disconnect from the first terminal 211, and may connect to a second terminal 213 having the next priority subsequent to the first terminal after identifying the capacitance of the first terminal 211 or after determining whether or not the capacitance of the first terminal 211 is equal to or greater than the specified second threshold value.

In an embodiment, if the switch 231 connects to the second terminal 213, the sensing unit 233 may identify the capacitance of the second terminal 213. In an embodiment, the sensing unit 233 may determine whether or not the capacitance of the second terminal is greater than or equal to the specified second threshold value by comparing the capacitance of the second terminal 213 with the specified second threshold value.

In an embodiment, the switch 231 may disconnect from the second terminal 213, and may connect to a third terminal 215 having the next priority subsequent to the second terminal 213 after identifying the capacitance of the second terminal 213 or after determining whether or not the capacitance of the second terminal 213 is equal to or greater than the specified second threshold value.

In an embodiment, if the switch 231 connects to the third terminal 215, the sensing unit 233 may identify the capacitance of the third terminal 215. In an embodiment, the sensing unit 233 may determine whether or not the capacitance of the third terminal 215 is greater than or equal to the specified second threshold value by comparing the capacitance of the third terminal 215 with the specified second threshold value.

In an embodiment, the switch 231 may disconnect from the third terminal 215, and may connect to a fourth terminal 217 having the next priority subsequent to the third terminal 215 after identifying the capacitance of the third terminal 215 or after determining whether or not the capacitance of the third terminal 215 is equal to or greater than the specified second threshold value.

In an embodiment, if the switch 231 connects to the fourth terminal 217, the sensing unit 233 may identify the capacitance of the fourth terminal 217. In an embodiment, the sensing unit 233 may determine whether or not the capacitance of the fourth terminal 217 is greater than or equal to the specified second threshold value by comparing the capacitance of the fourth terminal 217 with the specified second threshold value.

In an embodiment, the switch 231 may disconnect from the connection terminal 210 (or may switch from an active state to an inactive state) in response to a control signal received from the controller 220 after the switch 231 identifies the capacitance of the fourth terminal 217 or after the switch 231 determines whether or not the capacitance of the fourth terminal is equal to or greater than the specified second threshold value.

In an embodiment, if it is determined that all capacitance values sensed in the first to fourth terminals 211, 213, 215, and 217 are greater than or equal to a specified second threshold value, the sensing unit 233 may transmit, to the processor 240, information indicating that the capacitance values are greater than or equal to the specified second threshold value, and if it is determined that at least one of the capacitance values sensed in the plurality of terminals 211, 213, 215, and 217 is less than the specified second threshold value, the sensing unit 233 may transmit, to the processor 240, information indicating that the capacitance value is less than the specified second threshold value. However, the disclosure is not limited thereto. For example, if it is determined that at least one of the capacitance values sensed in the plurality of terminals 211, 213, 215, and 217 is greater than or equal to a specified second threshold value, the sensing unit 233 may transmit, to the processor 240, information indicating that the capacitance value is greater than or equal to the specified second threshold value, and if it is determined that all capacitance values sensed in the plurality of terminals 211, 213, 215, and 217 are less than the specified second threshold value, the sensing unit 233 may transmit, to the processor 240, information indicating that the capacitance values are less than the specified second threshold value.

In an embodiment, the sensing unit 233 may transmit, to the processor 240, the capacitance (or the amount of change in capacitance) of at least one terminal without transmitting the capacitance-related information to the processor. For example, the sensing unit 233 may transmit, to the processor 240, the capacitance sensed in at least one terminal without comparing the capacitance of at least one terminal with a specified second threshold value (or without determining a bit value related to the capacitance).

Figure 4:
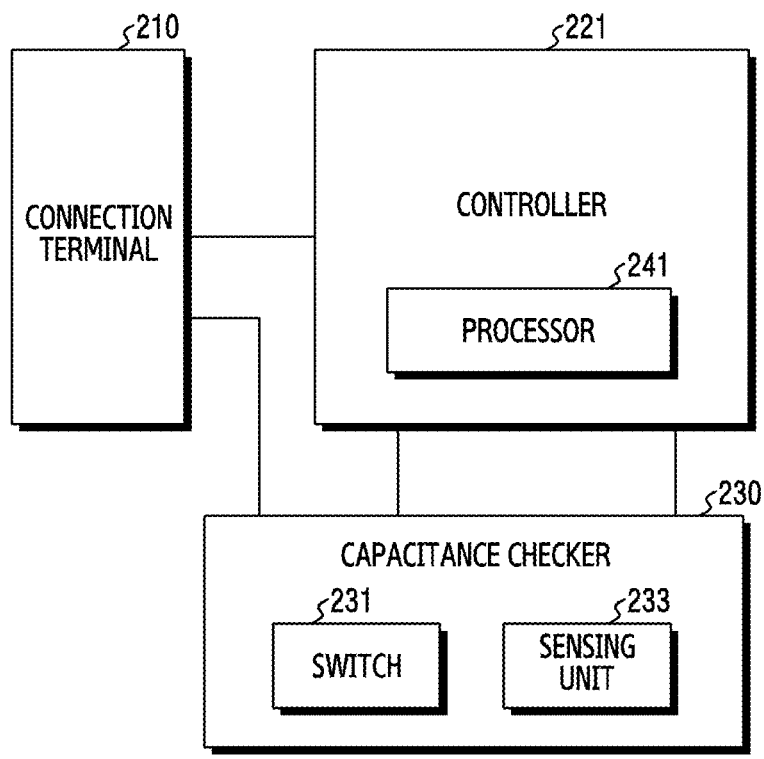
FIG. 4 is a diagram illustrating an electronic device for detecting water in a connection terminal according to various embodiments.

FIG. 4 is a diagram illustrating an electronic device 101 for detecting water in a connection terminal 210 according to various embodiments.

Referring to FIG. 4, in an embodiment, the electronic device 101 may include a connection terminal 210, a controller 221, and a capacitance checker 230.

In an embodiment, the connection terminal 210 and the capacitance checker 230 shown in FIG. 4 may be the same as the connection terminal 210 and the capacitance checker 230 shown in FIG. 2, respectively.

In an embodiment, the controller 221 may include a processor 241. In an embodiment, the processor 241 may be a microcontroller unit (MCU).

In an embodiment, since the functions performed by the controller 221 and the processor 241 shown in FIG. 4 are, at least in part, the same as or similar to the functions performed by the controller 220 and the processor 240 shown in FIG. 2, a detailed description thereof will be omitted.

An electronic device according to various embodiments may include: a connection terminal including at least one terminal; a controller configured to identify a resistance value of the at least one terminal; a capacitance checker configured to identify capacitance of the at least one terminal; and a processor, wherein the processor is configured to determine whether or not water is present in the at least one terminal, based at least in part on information related to the resistance value received from the controller and the capacitance received from the capacitance checker.

In various embodiments, the controller may be configured to: determine whether or not the resistance value is less than or equal to a specified first threshold value; if it is determined that the resistance value is less than or equal to the specified first threshold value, transmit, to the processor, information related to the resistance value, which indicates that the resistance value is less than or equal to the specified first threshold value; and if it is determined that the resistance value exceeds the specified first threshold value, transmit, to the processor, information related to the resistance value, which indicates that the resistance value exceeds the specified first threshold value.

In various embodiments, the capacitance checker may include a switch and a sensing unit. The switch may be configured to connect at least one terminal to the sensing unit, based at least in part on a control signal received from the controller, and the sensing unit may be configured to identify capacitance of the at least one terminal, determine whether or not the capacitance is greater than or equal to a specified second threshold value, if it is determined that the capacitance is greater than or equal to the specified second threshold value, transmit, to the processor, information related to the capacitance, which indicates that the capacitance is greater than or equal to the specified second threshold value, and if it is determined that the capacitance is less than the specified second threshold value, transmit, to the processor, information related to the capacitance, which indicates that the capacitance is less than the specified second threshold value.

In various embodiments, if the electronic device performs an operation of sensing whether or not water is present in the connection terminal, the specified second threshold value may be configured as a specified third threshold value, and if the electronic device performs an operation of sensing whether or not the connection terminal is in a dry state, the specified second threshold value may be configured as a specified fourth threshold value, which is less than the specified third threshold value.

In various embodiments, the processor may be configured to: if the information related to the resistance value indicates that the resistance value is less than or equal to the specified first threshold value, and if the information related to the capacitance indicates that the capacitance is greater than or equal to the specified second threshold value, determine that water is present in the connection terminal; if the information related to the resistance value indicates that the resistance value is less than or equal to the specified first threshold value, and if the information related to the capacitance indicates that the capacitance is less than the specified second threshold value, determine that foreign matter is present in the connection terminal; if the information related to the resistance value indicates that the resistance value exceeds the specified first threshold value, and if the information related to the capacitance indicates that the capacitance is greater than or equal to the specified second threshold value, determine that a circuit of the electronic device has been damaged; and if the information related to the resistance value indicates that the resistance value exceeds the specified first threshold value, and if the information related to the capacitance indicates that the capacitance is less than the specified second threshold value, determine that the connection terminal is in a dry state.

In various embodiments, the electronic device may further include a display device, and the processor may be configured to display information indicating that water is present in the connection terminal, information indicating that foreign matter is present in the connection terminal, or information indicating that a circuit of the electronic device has been damaged through the display device.

In various embodiments, the sensing unit may include a sensor configured to sense capacitance using a self-capacitance method.

In various embodiments, the connection terminal may be a universal serial bus (USB) connector.

An electronic device according to various embodiments may include: a connection terminal including at least one terminal; a capacitance checker configured to identify capacitance of the at least one terminal; and a controller, wherein the controller may be configured to identify a resistance value of the at least one terminal and determine whether or not water is present in the at least one terminal, based at least in part on information related to the resistance value and the capacitance received from the capacitance checker.

In various embodiments, the controller may be configured to determine whether or not the resistance value is less than or equal to the specified first threshold value. In various embodiments, the capacitance checker may include a switch and a sensing unit, and the switch may be configured to connect at least one terminal to the sensing unit, based at least in part on a control signal received from the controller. In addition, the sensing unit may be configured to identify capacitance of the at least one terminal and determine whether or not the capacitance is greater than or equal to a specified second threshold value.

In various embodiments, if the electronic device performs an operation of sensing whether or not water is present in the connection terminal, the specified second threshold value may be configured as a specified third threshold value, and if the electronic device performs an operation of sensing whether or not the connection terminal is in a dry state, the specified second threshold value may be configured as a specified fourth threshold value, which is less than the specified third threshold value.

In various embodiments, the controller may be configured to: if the resistance value is less than or equal to the specified first threshold value, and if the capacitance is greater than or equal to the specified second threshold value, determine that water is present in the connection terminal; if the resistance value is less than or equal to the specified first threshold value, and if the capacitance is less than the specified second threshold value, determine that foreign matter is present in the connection terminal; if the resistance value exceeds the specified first threshold value, and if the capacitance is greater than or equal to the specified second threshold value, determine that a circuit of the electronic device has been damaged; and if the resistance value exceeds the specified first threshold value, and if the capacitance is less than the specified second threshold value, determine that the connection terminal is in a dry state.

In various embodiments, the electronic device may further include a display device, and the controller may be configured to display information indicating that water is present in the connection terminal, information indicating that foreign matter is present in the connection terminal, or information indicating that a circuit of the electronic device has been damaged through the display device.

In various embodiments, the controller may include a processor configured to perform at least part of the operation of determining whether or not water is present in the at least one terminal.

In various embodiments, the connection terminal may be a universal serial bus (USB) connector.

Figure 5:
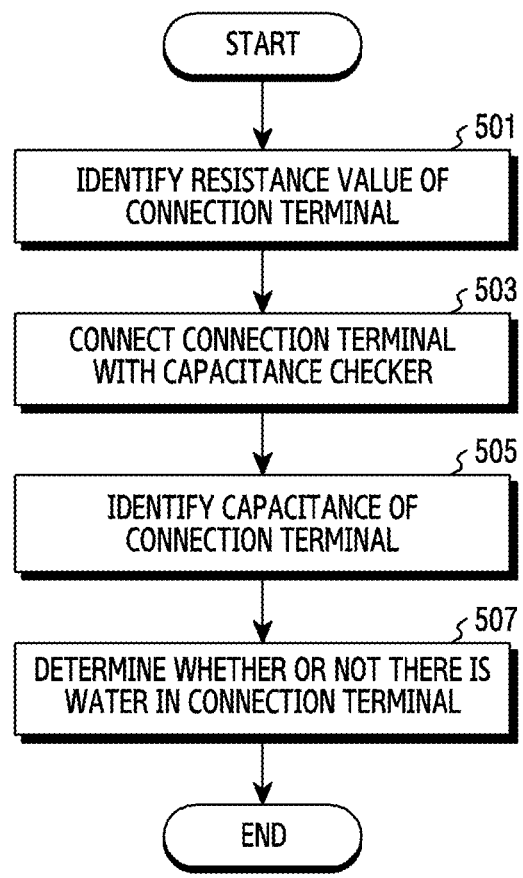
FIG. 5 is a flowchart illustrating an operation of sensing water in a connection terminal according to various embodiments.

FIG. 5 is a flowchart illustrating an operation of sensing water in a connection terminal 210 according to various embodiments.

Referring to FIG. 5, in an embodiment, the controller 220 may identify a resistance value of the connection terminal 210 in operation 501.

In an embodiment, the controller 220 may identify a resistance value of at least one terminal included in the connection terminal 210. For example, the controller 220 may identify a voltage value (or a voltage level) applied to a pull-down resistor (Rd) connected to at least one terminal included in the connection terminal 210.

In an embodiment, the controller 220 may convert an analog resistance value of at least one terminal into a digital resistance value.

In an embodiment, the controller 220 may compare a resistance value of at least one terminal (or a digital resistance value of at least one terminal) with a specified first threshold value. In an embodiment, according to the result of comparing the resistance value of at least one terminal with a specified first threshold value, the controller 220 may transmit, to the processor 240, information indicating that the resistance value of at least one terminal is less than or equal to the specified first threshold value or information indicating that the resistance value of at least one terminal exceeds the specified first threshold value.

In an embodiment, as a result of comparing the resistance value of at least one terminal with a specified first threshold value, if it is determined that the resistance value of at least one terminal is less than or equal to the specified first threshold value, the controller 220 may transmit, to the processor 240, information indicating that the resistance value of at least one terminal is less than or equal to the specified first threshold value. For example, if it is determined that a resistance value of at least one terminal is less than or equal to a specified first threshold value, the controller 220 may transmit, to the processor 240, a bit value "1" of a register (or a flag) (or information indicating that a resistance value of at least one terminal corresponds to a high level) (or may configure a register bit value as "1"). In an embodiment, if it is determined that the resistance value of at least one terminal exceeds a specified first threshold value, the controller 220 may transmit, to the processor 240, information indicating that the resistance value of at least one terminal exceeds the specified first threshold value. For example, if it is determined that a resistance value of at least one terminal is less than or equal to a specified first threshold value, the controller 220 may transmit, to the processor 240, a bit value "0" of a register (or information indicating that a capacitance value of at least one terminal corresponds to a low level) (or may configure a register bit value as "0").

In an embodiment, if it is determined that all resistance values of a plurality of terminals are less than or equal to a specified first threshold value, the controller 220 may transmit, to the processor 240, information indicating that the resistance values are less than or equal to the specified first threshold value, and if it is determined that at least one of the resistance values of a plurality of terminals exceeds a specified first threshold value, the controller 220 may transmit, to the processor 240, information indicating that the resistance value exceeds the specified first threshold value. However, the disclosure is not limited thereto. For example, if it is determined that at least one of the resistance values of a plurality of terminals is less than or equal to a specified first threshold value, the controller 220 may transmit, to the processor 240, information indicating that the resistance value is less than or equal to the specified first threshold value, and if it is determined that all resistance values of a plurality of terminals exceed a specified first threshold value, the controller 220 may transmit, to the processor 240, information indicating that the resistance values exceed the specified first threshold value.

In an embodiment, the controller 220 may identify the resistance values of a plurality of terminals in sequence. For example, the controller 220 may identify a resistance value of a first terminal (e.g., an SBU terminal) among a plurality of terminals, and may identify a resistance value of a second terminal (e.g., a CC terminal) after a specified delay time. However, the disclosure is not limited thereto. For example, the controller 220 may simultaneously identify the resistance values of a plurality of terminals.

In an embodiment, if the controller 220 sequentially identifies resistance values of a plurality of terminals, the controller 220 may identify the resistance values of the plurality of terminals in a specified order. For example, the controller 220 may identify the resistance value of an SBU terminal prior to the resistance value of a CC terminal in consideration of the fact that the number of functions performed through the SBU terminal is smaller than the number of functions performed through the CC1 terminal or the CC2 terminal. However, the method of determining the order of identifying the resistance values between the plurality of terminals is not limited thereto.

In operation 503, in an embodiment, the controller 220 may perform control such that the connection with at least one terminal is released and the connection terminal 210 and the capacitance checker 230 are connected to each other.

In an embodiment, the controller 220 may release the connection with at least one terminal after identifying the resistance value of at least one terminal or after transmitting resistance-value-related information to the processor 240. In an embodiment, the controller 220 may transmit, to the capacitance checker 230, a control signal for causing the capacitance checker 230 to switch from an inactive state to an active state. In an embodiment, the controller 220 may control the switch 231 such that the sensing unit 233 is connected to at least one terminal of the connection terminal 210 through the switch 231 after releasing the connection with at least one terminal (or at the same time as releasement of the connection).

In operation 505, in an embodiment, the capacitance checker 230 may identify capacitance of the connection terminal 210.

In an embodiment, the sensing unit 233 may sense (or detect) capacitance (or a capacitance value or the amount of change in capacitance) generated in at least one terminal of the connection terminal 210 connected through the switch 231.

In an embodiment, the sensing unit 233 may sense capacitance generated in at least one terminal by a self-capacitance method.

In an embodiment, the sensing unit 233 may sense capacitance that changes with the dielectric constant of a dielectric (or medium) inside at least one terminal.

In an embodiment, the sensing unit 233 may sense capacitance using at least one terminal among all terminals included in the connection terminal 210, regardless of the type of terminal.

In an embodiment, the sensing unit 233 may convert a sensed analog capacitance value into a digital capacitance value.

In an embodiment, the sensing unit 233 may compare the capacitance (or the amount of change in capacitance) of at least one terminal (or the digital capacitance value of at least one terminal) with a specified 2-1$^{st}$ threshold value.

According to an embodiment, the sensing unit 233 may transmit capacitance-related information to the processor 240 according to a result of comparing the capacitance of at least one terminal and a specified 2-1$^{st}$ threshold value.

In an embodiment, as a result of comparing the capacitance of at least one terminal and a specified 2-1$^{st}$ threshold value, if it is determined that the capacitance of at least one terminal is greater than or equal to the specified 2-1$^{st}$ threshold value, the sensing unit 233 may transmit, to the processor 240, information indicating that the capacitance value of at least one terminal is greater than or equal to the specified 2-1$^{st}$ threshold value. For example, if it is determined that the capacitance of at least one terminal is greater than or equal to the specified 2-1$^{st}$ threshold value, the sensing unit 233 may transmit, to the processor 240, a bit value "1" of a register (or a flag) (or information indicating that a capacitance value of at least one terminal corresponds to a high level) (or may configure a register bit value as "1"). In an embodiment, if it is determined that the capacitance of at least one terminal is less than the specified 2-1$^{st}$ threshold value, the sensing unit 233 may transmit, to the processor 240, information indicating that the capacitance of at least one terminal is less than the specified 2-1$^{st}$ threshold value. For example, if it is determined that the capacitance of at least one terminal is less than the specified 2-1$^{st}$ threshold value, the sensing unit 233 may transmit, to the processor 240, a bit value "0" of a register (or information indicating that a capacitance value of at least one terminal corresponds to a low level) (or may configure a register bit value as "0").

In an embodiment, if it is determined that all capacitance values sensed in a plurality of terminals are greater than or equal to a specified 2-1$^{st}$ threshold value, the sensing unit 233 may transmit, to the processor 240, information indicating that the capacitance values are greater than or equal to the specified 2-1$^{st}$ threshold value, and if it is determined that at least one of the capacitance values sensed in the plurality of terminals is less than the specified 2-1$^{st}$ threshold value, the sensing unit 233 may transmit, to the processor 240, information indicating that the capacitance value is less than the specified 2-1$^{st}$ threshold value. However, the disclosure is not limited thereto. For example, if it is determined that at least one of the capacitance values sensed in a plurality of terminals is greater than or equal to a specified 2-1$^{st}$ threshold value, the sensing unit 233 may transmit, to the processor 240, information indicating that the capacitance is greater than or equal to the specified 2-1$^{st}$ threshold value, and if it is determined that all capacitance values sensed in the plurality of terminals are less than the specified 2-1$^{st}$ threshold value, the sensing unit 233 may transmit, to the processor 240, information indicating that the capacitance values are less than the specified 2-1$^{st}$ threshold value.

In an embodiment, the sensing unit 233 may transmit, to the processor 240, the capacitance (or the amount of change in capacitance) of at least one terminal without transmitting the capacitance-related information to the processor. For example, the sensing unit 233 may transmit, to the processor 240, the capacitance sensed in at least one terminal without comparing the capacitance of at least one terminal with a specified second threshold value (or without determining a bit value related to the capacitance).

In operation 507, in an embodiment, the processor 240 may determine whether or not there is water in the connection terminal 210.

In an embodiment, the processor 240 may determine whether or not water is present in the at least one terminal, based on the resistance-value-related information received from the controller 220 and the capacitance-related information received from the sensing unit 233.

In an embodiment, if information indicating that the resistance value of at least one terminal is less than or equal to a specified first threshold value is received from the controller 220, and if information indicating that the capacitance of at least one terminal is greater than or equal to a specified 2-1$^{st}$ threshold value is received from the sensing unit 233, the processor 240 may determine that water is present in the connection terminal 210.

In an embodiment, if information indicating that the resistance value of at least one terminal is less than or equal to a specified first threshold value is received from the controller 220, and if information indicating that the capacitance of at least one terminal is less than a specified 2-1$^{st}$ threshold value is received from the sensing unit 233, the processor 240 may determine that foreign matter is present in the connection terminal 210.

In an embodiment, if information indicating that the resistance value of at least one terminal exceeds a specified first threshold value is received from the controller 220, and if information indicating that the capacitance of at least one terminal is greater than or equal to a specified 2-1$^{st}$ threshold value is received from the sensing unit 233, the processor 240 may determine that a circuit of the electronic device 101 has been damaged.

In an embodiment, if information indicating that the resistance value of at least one terminal exceeds a specified first threshold value is received from the controller 220, and if information indicating that the capacitance of at least one terminal is less than a specified 2-1$^{st}$ threshold value is received from the sensing unit 233, the processor 240 may determine that no water or foreign matter is present in the connection terminal 210 and that no circuit of the electronic device 101 has been damaged (or that the connection terminal 210 is in a dry state).

In an embodiment, if it is determined that water is present in the connection terminal 210, the processor 240 may control the electronic device 101 so as to perform a dryness sensing operation.

In an embodiment, if the sensing unit 233 transmits, to the processor 240, the capacitance of at least one terminal without transmitting the capacitance-related information to the processor, the processor 240 may perform an operation of comparing the capacitance of at least one terminal with a specified second threshold value, thereby determining whether or not the capacitance of at least one terminal is greater than or equal to the specified second threshold value. In an embodiment, the processor 240 may configure a register bit value, based on the result of comparing the capacitance of at least one terminal with the specified second threshold value.

Although not shown in FIG. 5, in an embodiment, the processor 240 may display another screen according to whether or not water is present in at least one terminal through the display device 160 after performing the water sensing operation.

Figure 6:
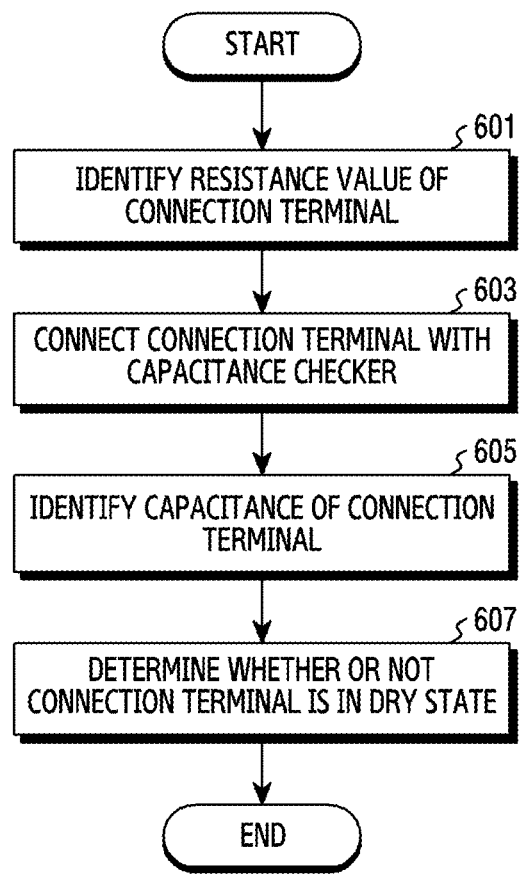
FIG. 6 is a flowchart illustrating an operation of sensing dryness in a connection terminal according to various embodiments.

FIG. 6 is a flowchart illustrating an operation for sensing dryness in the connection terminal 210 according to various embodiments.

Referring to FIG. 6, in operation 601, the controller 220 may identify a resistance value of at least one terminal included in the connection terminal 210. In an embodiment, the controller 220 may identify a resistance value of at least one terminal included in the connection terminal 210 in response to the reception of a control signal for performing a dryness sensing operation from the processor 240.

Since operation 601 in FIG. 6 is, at least in part, the same as or similar to operation 501 in FIG. 5, a detailed description thereof will be omitted.

In operation 603, in an embodiment, the controller 220 may perform control such that the connection with at least one terminal is released and the connection terminal 210 and the capacitance checker 230 are connected to each other.

Since operation 603 in FIG. 6 is, at least in part, the same as or similar to operation 503 in FIG. 5, a detailed description thereof will be omitted.

In operation 605, in an embodiment, the capacitance checker 230 may identify the capacitance of the connection terminal 210.

In an embodiment, the sensing unit 233 may sense (or detect) the capacitance (or a capacitance value or the amount of change in capacitance) generated in at least one terminal of the connection terminal 210 connected through the switch 231.

In an embodiment, the sensing unit 233 may sense the capacitance generated in at least one terminal by a self-capacitance method.

In an embodiment, the sensing unit 233 may sense the capacitance that changes with a dielectric constant of a dielectric (or medium) inside at least one terminal.

In an embodiment, the sensing unit 233 may sense capacitance using at least one terminal among all terminals included in the connection terminal 210, regardless of the type of terminal.

According to an embodiment, the sensing unit 233 may convert a sensed analog capacitance value into a digital capacitance value.

In an embodiment, the sensing unit 233 may compare the capacitance (or the amount of change in capacitance) of at least one terminal (or the digital capacitance value of at least one terminal) with a specified $2\text{-}2^{nd}$ threshold value.

In an embodiment, the sensing unit 233 may transmit capacitance-related information to the processor 240 according to the result of comparing the capacitance value of at least one terminal and the specified $2\text{-}2^{nd}$ threshold value.

In an embodiment, the sensing unit 233 may transmit, to the processor 240, the capacitance (or the amount of change in capacitance) of at least one terminal without transmitting the capacitance-related information to the processor. In an embodiment, the specified $2\text{-}2^{nd}$ threshold value may be set to be lower than the specified $2\text{-}1^{st}$ threshold value. For example, the specified $2\text{-}2^{nd}$ threshold value may be set to be lower than the specified $2\text{-}1^{st}$ threshold value by a value due to (in consideration of) hysteresis. In an embodiment, by setting the specified $2\text{-}2^{nd}$ threshold value to be lower than the specified $2\text{-}1^{st}$ threshold value, it is possible to prevent the result of the dryness sensing operation from being changed frequently because the capacitance of at least one terminal sensed in the dryness sensing operation frequently changes within a specified range exceeding the specified $2\text{-}1^{st}$ threshold value and a specified range less than the specified $2\text{-}1^{st}$ threshold value.

In an embodiment, as a result of comparing the capacitance of at least one terminal with a specified $2\text{-}2^{nd}$ threshold value, if it is determined that the capacitance of at least one terminal is greater than or equal to the specified $2\text{-}2^{nd}$ threshold value, the sensing unit 233 may transmit, to the processor 240, information indicating that the capacitance of at least one terminal is greater than or equal to the specified $2\text{-}2^{nd}$ threshold value.

In an embodiment, if it is determined that the capacitance of at least one terminal is less than the specified $2\text{-}2^{nd}$ threshold value, the sensing unit 233 may transmit, to the processor 240, information indicating that the capacitance of at least one terminal is less than the specified $2\text{-}2^{nd}$ threshold value.

In operation 607, in an embodiment, the processor 240 may determine whether or not the connection terminal 210 is in a dry state.

In an embodiment, the processor 240 may determine whether or not the connection terminal 210 is in a dry state, based at least in part on the resistance-value-related information received from the controller 220 and the capacitance-related information received from the sensing unit 233.

In an embodiment, if information indicating that the resistance value of at least one terminal is less than or equal to a specified first threshold value is received from the controller 220, and if information indicating that the capacitance of at least one terminal is greater than or equal to a specified $2\text{-}2^{nd}$ threshold value is received from the sensing unit 233, the processor 240 may determine that water is present in the connection terminal 210.

In an embodiment, if information indicating that the resistance value of at least one terminal is less than or equal to a specified first threshold value is received from the controller 220, and if information indicating that the capacitance of at least one terminal is less than a specified $2\text{-}2^{nd}$ threshold value is received from the sensing unit 233, the processor 240 may determine that foreign matter is present in the connection terminal 210 (or that water has not been removed).

In an embodiment, if information indicating that the resistance value of at least one terminal exceeds a specified first threshold value is received from the controller 220, and if information indicating that the capacitance of at least one terminal is greater than or equal to a specified $2\text{-}2^{nd}$ threshold value is received from the sensing unit 233, the processor 240 may determine that a circuit of the electronic device 101 is damaged (or that water has not been removed).

In an embodiment, if information indicating that the resistance value of at least one terminal exceeds a specified first threshold value is received from the controller 220, and if information indicating that the capacitance of at least one terminal is less than a specified $2\text{-}2^{nd}$ threshold value is received from the sensing unit 233, the processor 240 may determine that the connection terminal 210 is in a dry state (or that water has been removed).

In an embodiment, if the sensing unit 233 transmits, to the processor 240, the capacitance of at least one terminal without transmitting the capacitance-related information to the processor, the processor 240 may perform an operation of comparing the capacitance of at least one terminal with a specified second threshold value, thereby determining whether or not the capacitance of at least one terminal is greater than or equal to the specified second threshold value. In an embodiment, the processor 240 may configure a register bit value, based on the result of comparing the capacitance of at least one terminal with the specified second threshold value.

Although not shown in FIG. 6, in an embodiment, the dryness sensing operation may be repeatedly performed. For example, if the processor 240 determines that there is water in the connection terminal 210 in a first dryness sensing operation, the processor 240 may perform control such that the electronic device 101 (e.g., the controller 220) performs a second dryness sensing operation.

In an embodiment, if the processor 240 determines that there is no water in the connection terminal 210 (e.g., if the processor 240 determines that foreign matter is present in the connection terminal 210, that a circuit of the electronic device 101 has been damaged, or that the connection terminal 210 is in a dry state), the processor 240 may terminate the dryness sensing operation.

In an embodiment, if the processor 240 determines that foreign matter is present in the connection terminal 210 in the dryness sensing operation, the processor 240 may perform control such that the electronic device 101 (e.g., the controller 220) performs a water sensing operation.

In an embodiment, if the processor 240 determines that a circuit of the electronic device 101 has been damaged in the dryness sensing operation, the processor 240 may perform control such that the electronic device 101 (e.g., the controller 220) performs the dryness sensing operation again.

Although not shown in FIG. 6, in an embodiment, if the processor 240 determines that water present in at least one terminal has been removed through the dryness sensing operation, the processor 240 may control the display device 160 such that the information indicating that there is water in the connection terminal 210 disappears.

Figure 7A:
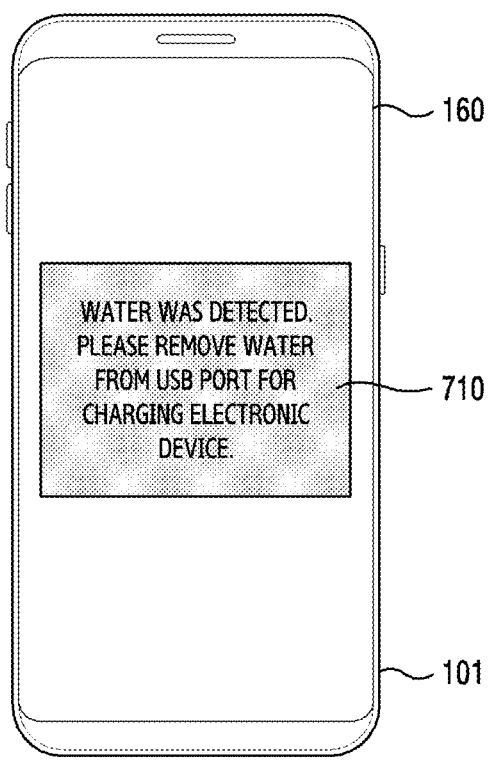
FIG. 7A is a diagram illustrating an example of a screen showing a result of a water sensing operation according to various embodiments.
Figure 7B:
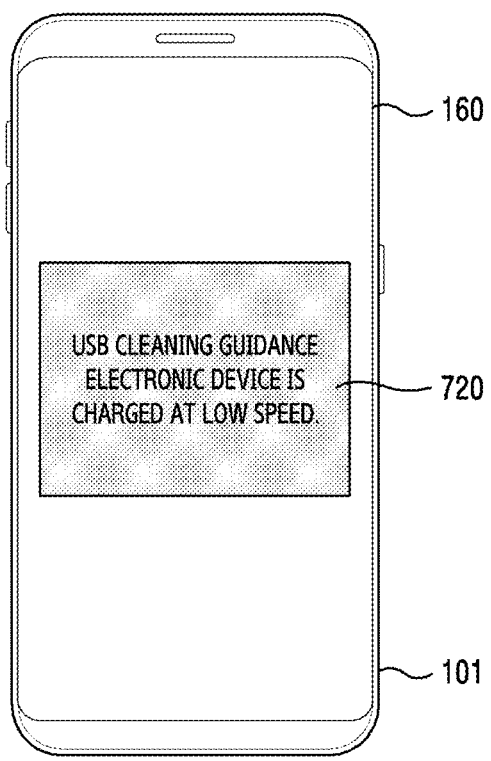
FIG. 7B is a diagram illustrating an example of a screen showing a result of a water sensing operation according to various embodiments.
Figure 7C:
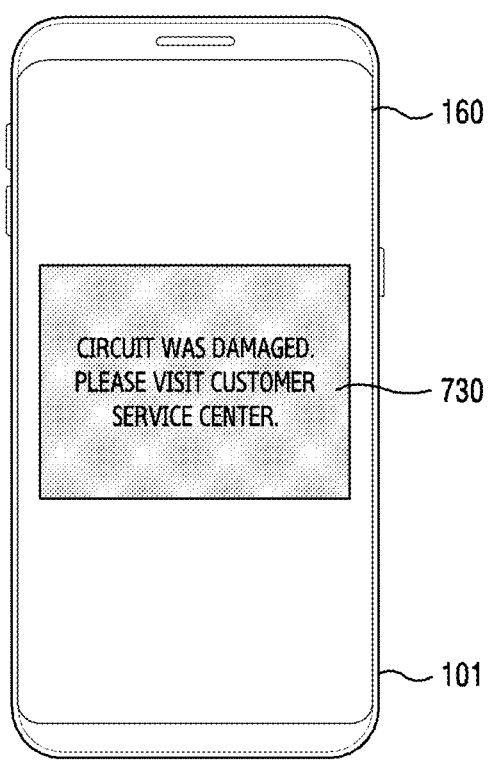
FIG. 7C is a diagram illustrating an example of a screen showing a result of a water sensing operation according to various embodiments.

FIG. 7A is a diagram illustrating an example of a screen showing the result of a water sensing operation according to various embodiments, FIG. 7B is a diagram illustrating an example of a screen showing the result of a water sensing operation according to various embodiments, and FIG. 7C is a diagram illustrating an example of a screen showing the result of a water sensing operation according to various embodiments.

Referring to FIGS. 7A to 7C, in an embodiment, the processor 240 may display another screen according to whether or not water is present in at least one terminal through a display device after performing a water sensing operation.

In an embodiment, if it is determined that there is water in the connection terminal 210, the processor 240 may display information indicating that there is water in the connection terminal 210.

In an embodiment, if it is determined that there is water in the connection terminal 210, the processor 240 may display information indicating that a charging operation is to be performed after the water in the connection terminal 210 is removed through the display device 160.

In an embodiment, as shown in FIG. 7A, if it is determined that there is water in the connection terminal 210, the processor 240 may display, on the display device 160, information 710 indicating that there is water in the connection terminal 210 and that a charging operation is to be performed after the water in the connection terminal 210 is removed.

In an embodiment, if it is determined that the foreign matter is present in the connection terminal 210, the processor 240 may display information indicating that the foreign matter is present in the connection terminal 210 through the display device 160.

In an embodiment, if it is determined that the foreign matter is present in the connection terminal 210, the processor 240 may display cleaning guidance for removing the foreign matter from the connection terminal 210 through the display device 160. In an embodiment, if it is determined that foreign matter is present in the connection terminal 210, and if a charging adapter is connected to the electronic device 101, the processor 240 may perform an operation for charging the electronic device 101 at a low speed. For example, in an embodiment, if it is determined that foreign matter is present in the connection terminal 210, and if a charging adapter is connected to the electronic device 101, the processor 240 may perform an operation of adjusting a current level (or a voltage level) for charging the electronic device 101.

In an embodiment, as shown in FIG. 7B, if it is determined that foreign matter is present in the connection terminal 210, the processor 240 may display, on the display device 160, information 720 about cleaning guidance and low-speed charging of the electronic device 101 through the display device 160.

In an embodiment, if it is determined that a circuit of the electronic device 101 has been damaged, the processor 240 may display information indicating that the circuit of the electronic device 101 has been damaged through the display device 160. In an embodiment, if it is determined that a circuit of the electronic device 101 has been damaged, the processor 240 may display information asking a user to visit a customer service center through the display device 160.

In an embodiment, as shown in FIG. 7C, if it is determined that a circuit of the electronic device 101 has been damaged, the processor 240 may display, on the display device 160, information 730 indicating that a circuit of the electronic device 101 has been damaged and asking a user to visit a customer service center.

Although not shown in FIGS. 7A to 7C, in an embodiment, if the processor 240 determines that water is still present in the connection terminal 210 after performing the dryness sensing operation, the processor 240 may control the display device 160 so as to maintain the display of information (e.g., the information 710) indicating that water is present in the connection terminal 210.

In an embodiment, if the processor 240 determines that no water is present in the connection terminal 210 (or that the connection terminal 210 is in a dry state) after performing the dryness sensing operation, the processor 240 may control the display device 160 such that the information (e.g., the information 710) indicating the presence of water disappears.

Figure 8:
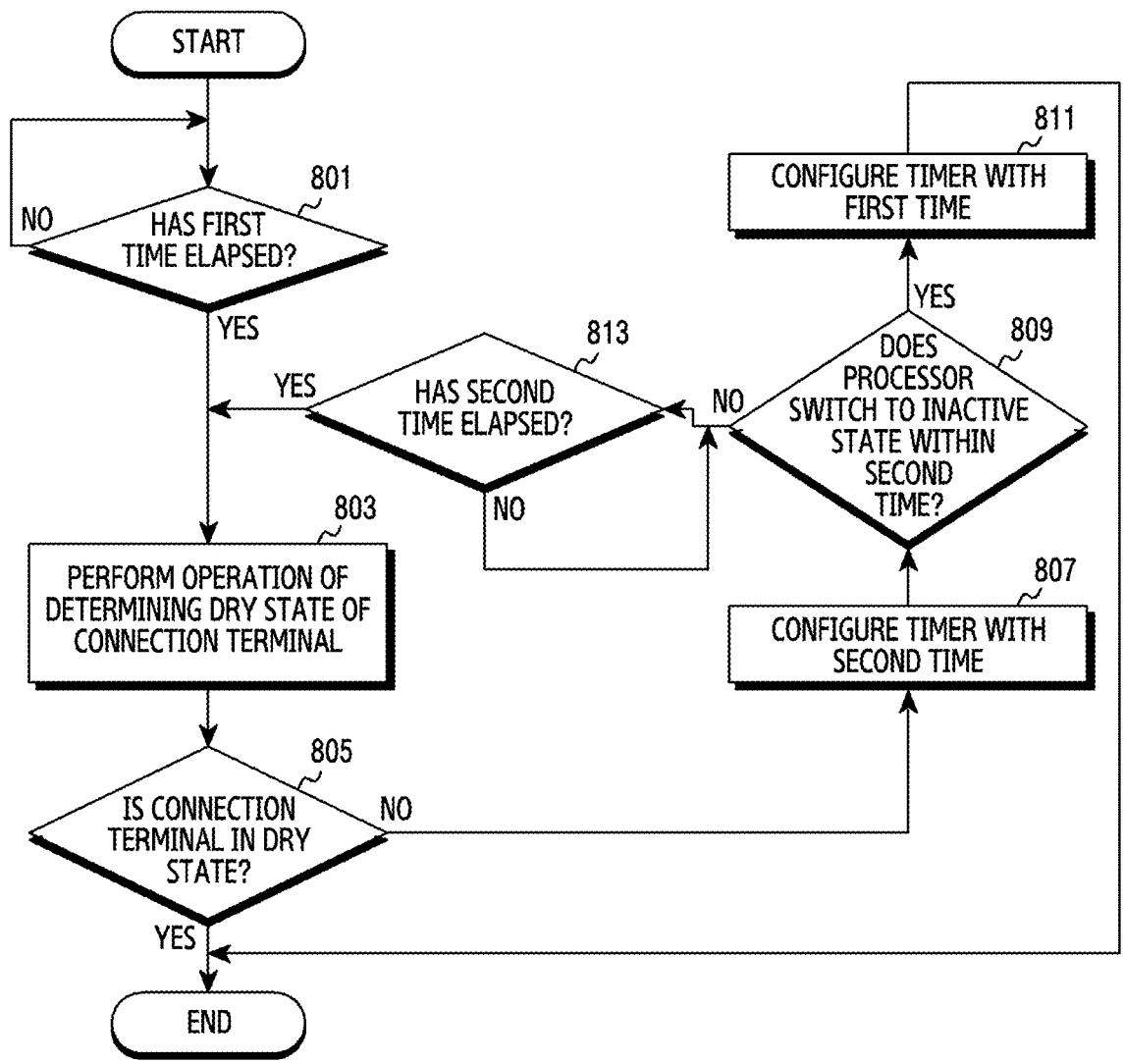
FIG. 8 is a flowchart illustrating a method of performing a dryness sensing operation using a timer according to various embodiments.

FIG. 8 is a flowchart illustrating a method of performing a dryness sensing operation using a timer according to various embodiments.

Referring to FIG. 8, in operation 801, the processor 240 may determine whether or not a first time configured in a timer has elapsed (or has expired) in response to the switching of the processor 240 from an inactive state (or a suspended state or a sleep state) to an active state (or a resume state or a wake-up state) (or when the processor 240 in an inactive state is activated).

In an embodiment, the timer may configure a first time in response to the reception of information indicating that water is present in the connection terminal 210 through a water sensing operation from the controller 220 (or may be configured such that the timer expires when a first time elapses). In an embodiment, in the case where the timer is configured with a first time, if the first time has not elapsed, the timer may configure a flag bit value as "0", and if the first time has elapsed, the timer may configure a flag bit value as "1".

In an embodiment, the processor 240 may identify a flag bit value. If the flag bit value is configured as "0", the processor 240 may determine that the first time has not elapsed. If the flag bit value is configured as "1", the processor 240 may determine that the first time has elapsed.

In an embodiment, if the processor 240 determines that the first time has not elapsed, the processor 240 may continuously (or periodically) determine whether or not the first time has elapsed.

In an embodiment, if the processor 240 determines that the first time has elapsed, the processor 240 may perform an operation of determining the dry state of the connection terminal 210 in operation 803.

In an embodiment, the processor 240 may control the controller 220 and the capacitance checker 230 so as to perform the dryness sensing operation described with reference to FIGS. 2 to 5.

In an embodiment, the processor 240 may control the controller 220 so as to perform the dryness sensing operation without using the capacitance checker 230. For example, the processor 240 may determine whether or not the connection terminal 210 is in a dry state, based at least in part on resistance-value-related information of the connection terminal 210 received from the controller 220, without using capacitance-related information of the connection terminal 210. In an embodiment, in the case where the processor 240 determines whether or not the connection terminal 210 is in a dry state, based at least in part on the resistance-value-related information of the connection terminal 210 received from the controller 220, without using the capacitance-related information of the connection terminal 210, the electronic device 101 may not include the capacitance checker 230.

In an embodiment, if the processor 240 determines that the connection terminal 210 is in the dry state in operation 805, the dryness sensing operation may end.

In an embodiment, if the processor 240 determines that the connection terminal 210 is not in the dry state (e.g., determines that there is water in the connection terminal 210) in operation 805, the processor 240 may configure the timer with a second time.

In an embodiment, in the case where the timer is configured with a second time, if the second time has not elapsed, the timer may configure a flag bit value as "0", and if the second time has elapsed, the timer may configure a flag bit value as "1".

In an embodiment, the second time may be more than the first time. For example, the second time may be about 30 minutes and the first time may be about 10 minutes.

In FIG. 8, it is illustrated that the processor 240 configures the timer with the second time if it is determined that the connection terminal 210 is not in the dry state in operation 807, but in an embodiment, the processor 240 may configure the timer with the second time in response to identifying that the first timer has elapsed in operation 801.

In an embodiment, the processor 240 may determine whether or not an event for switching the processor 240 from an active state to an inactive state occurs within the second time in operation 809. For example, the processor 240 may determine whether or not an input for turning off the electronic device 101 is received from the user. As another example, the processor 240 may determine whether or not an event for terminating a running application occurs. However, an event for switching the processor 240 from an active state to an inactive state is not limited to the above-described examples.

In an embodiment, if the processor 240 determines that an event for switching the processor 240 from an active state to an inactive state occurred within the second time in operation 809, the processor 240, for example, may configure the timer with the first time before switching to the inactive state in operation 811. For example, the processor 240 may initialize the elapsed time of the timer configured with the second time, and may configure the timer with the first time.

In an embodiment, if it is determined that an event for switching the processor 240 from an active state to an inactive state has not occurred within the second time in operation 809, the processor 240 may determine whether or not the second time has elapsed in operation 813. For example, the processor 240 may determine whether or not the flag bit value is "0" or "1".

In an embodiment, if the processor 240 determines that the second time has elapsed, the processor 240 may perform the operation of determining the dry state of the connection terminal 210 in operation 803.

Although not shown in FIG. 8, in the state in which the timer is configured with the first time or the second time, the timer may initialize the elapsed time of the timer, and may configure the timer with the first time in response to the reception of information indicating that water is present in the connection terminal 210 through the water sensing operation from the controller 220.

In an embodiment, it is possible to increase a period in which the electronic device 101 performs the dryness sensing operation while a user uses the electronic device 101 by configuring the timer with the first time if the processor 240 is in an inactive state and by configuring the timer with the second time longer than the first time if the processor 240 is in an active state. This may reduce corrosion of the electronic device 101 and power consumption of the electronic device 101. In addition, the processor 240 may perform the dryness sensing operation using a timer, regardless of the reception of an interrupt from the controller 220 (e.g., the reception of information indicating that water is present in the connection terminal 210 through the water sensing operation) or regardless of interrupt missing or an invalid interrupt, thereby accurately determining whether or not the connection terminal 210 is in a dry state. In addition, since the dryness sensing operation is performed while the processor 240 is in an active state, the user can immediately determine whether or not the connection terminal 210 is in a dry state.

Although FIG. 8 illustrates that the state in which the user uses the electronic device 101 is represented by the state in which the processor 240 is activated, the disclosure is not limited thereto. For example, the state in which the user uses the electronic device 101 may be represented by the state in which the display device 160 is turned on, the state in which a specified application (e.g., a music application) is being executed, or the like, instead of the state in which the processor 240 is activated. For example, the timer may be configured with a first time while the display device 160 is in an inactive state, and the timer may be configured with a second time longer than the first time while the display device 160 is in an active state.

Figure 9:
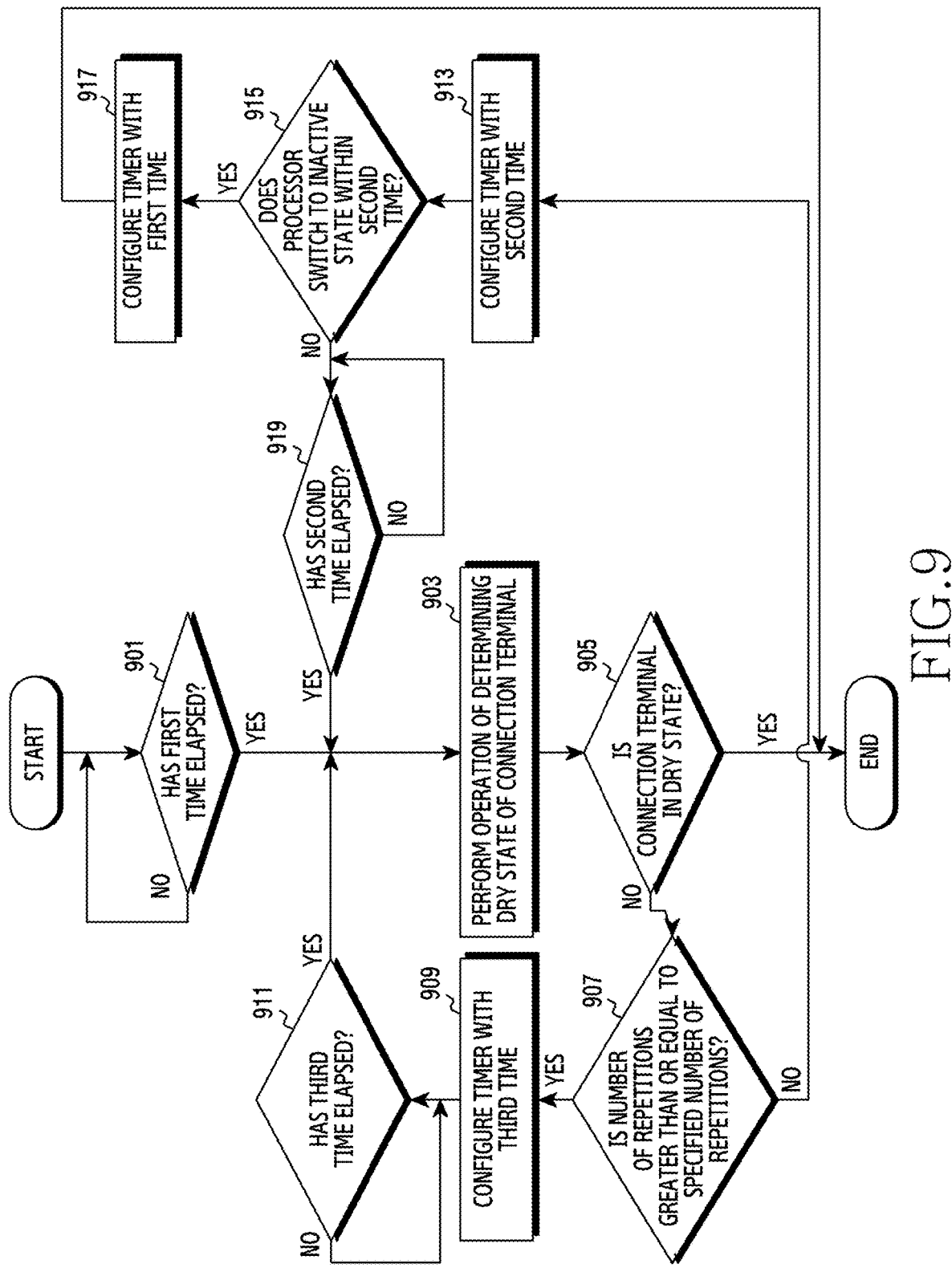
FIG. 9 is a flowchart illustrating a method of performing a dryness sensing operation using a timer according to various embodiments.

FIG. 9 is a flowchart illustrating a method of performing a dryness sensing operation using a timer according to various embodiments.

Referring to FIG. 9, since operations 901 to 905 are, at least in part, the same as or similar to operations 801 to 805 in FIG. 8, a detailed description thereof will be omitted.

In operation 907, in an embodiment, the processor 240 may determine whether or not the number of times that an operation of determining the dry state of the connection terminal 210 is performed is greater than or equal to a specified number of repetitions (e.g., about six times).

In an embodiment, the processor 240 may repeatedly perform an operation of determining the dry state of the connection terminal 210 in operation 903. In an embodiment, the processor 240 may repeatedly perform an operation of determining the dry state of the connection terminal 210 after the timer receives, from the controller 220, information indicating that there is water in the connection terminal 210 through the water sensing operation until the timer again receives, from the controller 220, information indicating that there is water in the connection terminal 210 through the water sensing operation.

For example, the processor 240 may perform the operation of determining the dry state of the connection terminal 210 at intervals corresponding to the second time while the processor 240 is in an active state after the timer receives, from the controller 220, information indicating that there is water in the connection terminal 210 through the water sensing operation until the timer again receives, from the controller 220, information indicating that there is water in the connection terminal 210 through the water sensing operation in operation 903.

As another example, the processor 240 may switch from an inactive state to an active state several times after the timer receives, from the controller 220, information indicating that there is water in the connection terminal 210 through the water sensing operation until the timer again receives, from the controller 220, information indicating that there is water in the connection terminal 210 through the water sensing operation. The processor 240 may perform an operation of determining the dry state of the connection terminal 210 in response to identifying that a bit value of the timer is configured as "1" whenever the processor 240 switches from an inactive state to an active state in operation 903, thereby repeating the operation of determining the dry state of the connection terminal 210.

In an embodiment, if it is determined that the number of times the operation of determining the dry state of the connection terminal 210 is performed is greater than or equal to a specified number of repetitions in operation 907, the processor 240 may configure the timer with a third time in operation 909.

In an embodiment, the third time (e.g., about 30 minutes) may be equal to the second time (e.g., about 30 minutes). However, the third time is not limited thereto, and the third time may be set to be different from the second time. For example, in the case where the timer is configured with the third time, the timer may configure a flag bit value as "0" if the third time has not elapsed, and the timer may configure a flag bit value as "1" if the third time has elapsed.

In operation 911, in an embodiment, the processor 240 may determine whether or not the third time has elapsed. For example, the processor 240 may determine whether or not a bit value of the timer is "0" or "1". In an embodiment, if the processor 240 determines that the third time has elapsed, the processor 240 may perform the operation of determining the dry state of the connection terminal 210 in operation 903. For example, if the processor 240 determines that the bit value of the timer is "1", the processor 240 may perform the operation of determining the dry state of the connection terminal 210 in operation 903.

Although not shown in FIG. 9, if the processor 240 determines that an event for switching the processor 240 from an active state to an inactive state occurred in operation 911, the processor 240 may initializes the elapsed time of the timer, and may configure the timer with a third time. In an embodiment, if the processor 240 switches to the inactive state after performing the operation of configuring the timer with the third time in operation 909, and then if the processor 240 switches from the inactive state to the active state again, the operation of determining whether or not the third time has elapsed may be performed in operation 901, instead of performing the operation of determining whether or not the first time has elapsed. The processor 240 may perform operations 903 to 917 after performing the operation of determining whether or not the third time has elapsed.

In an embodiment, if it is determined that the number of times the operation of determining the dry state of the connection terminal 210 is performed is less than a specified number of repetitions in operation 907, the processor 240 may configure the timer with a second time in operation 913.

Since operations 913 to 919 are, at least in part, the same as or similar to operations 807 to 813 in FIG. 8, a detailed description thereof will be omitted.

Figure 10:
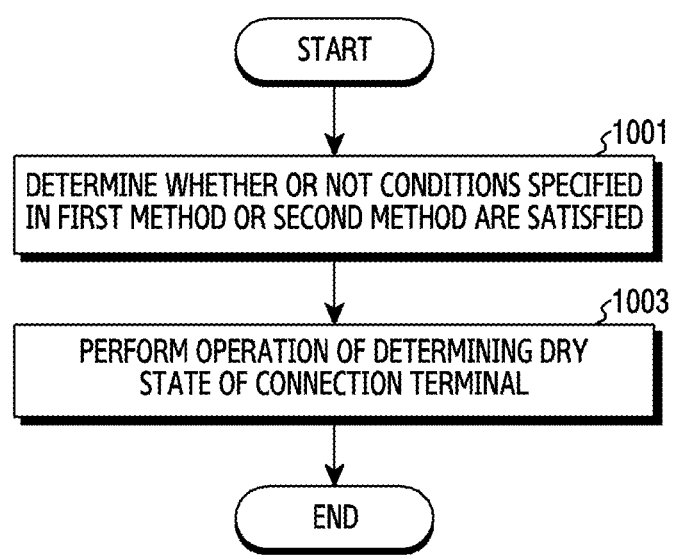
FIG. 10 is a flowchart illustrating a method of performing a dryness sensing operation using an interrupt and a timer according to various embodiments.

FIG. 10 is a flowchart illustrating a method of performing a dryness sensing operation using an interrupt and a timer according to various embodiments.

Referring to FIG. 10, in an embodiment, the processor 240 may determine whether or not conditions specified to perform (or initiate) an operation of determining the dry state of the connection terminal 210 in a first method or a second method (or conditions for triggering an operation of determining the dry state of the connection terminal 210) are satisfied in operation 1001.

In an embodiment, the first method may be a method in which the processor 240 performs an operation of determining the dry state of the connection terminal 210 in response to the reception of an interrupt (e.g., detach interrupt request) from the controller 220, such as information indicating that there is water in the connection terminal 210 through a water sensing operation.

In an embodiment, the second method may be a method in which the processor 240 performs an operation of determining the dry state of the connection terminal 210 in response to identifying that the time configured in a timer has elapsed, using the timer described with reference to FIG. 8 or 9.

In an embodiment, if the processor 240 receives an interrupt from the controller 220 according to the first method, the processor 240 may determine that the conditions specified to perform (or initiate) an operation of determining the dry state of the connection terminal 210 are satisfied.

In an embodiment, if the processor 240 determines that the time configured in the timer has elapsed according to the second method, the processor 240 may determine that the conditions specified to perform (or initiate) an operation of determining the dry state of the connection terminal 210 are satisfied.

In an embodiment, the processor 240 may use the first method and the second method in parallel.

For example, if the processor 240 receives an interrupt from the controller 220 before the time configured in the timer elapses, the processor may determine to perform an operation of determining the dry state of the connection terminal 210. As another example, if the processor 240 determines that the time configured in the timer has elapsed before receiving an interrupt from the controller 220, the processor 240 may determine to perform an operation of determining the dry state of the connection terminal 210.

In an embodiment, if the interrupt received from the controller according to the first method is invalid, the processor 240 may use only the second method. For example, if a first interrupt received from the controller according to the first method indicates that water is present in the connection terminal 210, and if a second interrupt received within a specified time after receiving the first interrupt indicates that there is no water in the connection terminal 210, the processor 240 may determine that the first and second interrupts received from the controller 220 are invalid. If the processor 240 determines that the first and second interrupts received from the controller 220 are invalid, the processor 240 may use only the second method.

In an embodiment, the processor 240 may perform an operation of determining the dry state of the connection terminal 210 in operation 1003.

Since operation 1003 is, at least in part, the same as or similar to operation 803 in FIG. 8, a detailed description thereof will be omitted.

A method according to various embodiments may include operations of identifying a resistance value of at least one terminal included in a connection terminal by a controller of an electronic device, identifying capacitance of the at least one terminal by a capacitance checker of the electronic device, and determining whether or not water is present in the at least one terminal, based at least in part on information related to the resistance value received from the controller and the capacitance received from the capacitance checker.

According to various embodiments, the operation of identifying the resistance value of at least one terminal included in the connection terminal by the controller may include operations of: determining whether or not the resistance value is less than or equal to a specified first threshold value; if it is determined that the resistance value is less than or equal to the specified first threshold value, transmitting, to the processor, information related to the resistance value, which indicates that the resistance value is less than or equal to the specified first threshold value; and if it is determined that the resistance value exceeds the specified first threshold value, transmitting, to the processor, information related to the resistance value, which indicates that the resistance value exceeds the specified first threshold value.

In various embodiments, the capacitance checker may include a switch and a sensing unit. The method may further include an operation of connecting the at least one terminal to the sensing unit by the switch, based at least in part on a control signal received from the controller, and the operation of identifying the capacitance of the at least one terminal by the capacitance checker may include operations of: identifying the capacitance of the at least one terminal by the sensing unit; and transmitting the identified capacitance of the at least one terminal to the processor. The operation of determining whether or not water is present in the at least one terminal may further include an operation of determining whether or not the capacitance is greater than or equal to a specified second threshold value.

In various embodiments, if the electronic device performs an operation of sensing whether or not water is present in the connection terminal, the specified second threshold value may be configured as a specified third threshold value, and if the electronic device performs an operation of sensing whether or not the connection terminal is in a dry state, the specified second threshold value may be configured as a specified fourth threshold value, which is less than the specified third threshold value.

In various embodiments, the operation of determining whether or not water is present in the at least one terminal may include operations of: if the resistance value is less than or equal to the specified first threshold value, and if the capacitance is greater than or equal to the specified second threshold value, determining that water is present in the connection terminal; if the resistance value is less than or equal to the specified first threshold value, and if the capacitance is less than the specified second threshold value, determining that foreign matter is present in the connection terminal; if the resistance value exceeds the specified first threshold value, and if the capacitance is greater than or equal to the specified second threshold value, determining that a circuit of the electronic device has been damaged; and if the resistance value exceeds the specified first threshold value, and if the capacitance is less than the specified second threshold value, determining that the connection terminal is in a dry state.

In various embodiments, the method may further include an operation of displaying information indicating that water is present in the connection terminal, information indicating that foreign matter is present in the connection terminal, or information indicating that a circuit of the electronic device has been damaged through a display device of the electronic device.

In various embodiments, the controller may include the processor.

In various embodiments, the connection terminal may be a universal serial bus (USB) connector.

A method according to various embodiments may include operations of: if a processor of an electronic device switches from an inactive state to an active state while the electronic device senses the dry state of at least one terminal included in a connection terminal, determining whether or not a first time configured in a timer of the electronic device has elapsed; if it is determined that the first time has elapsed, determining whether or not water is present in the at least one terminal by a controller of the electronic device; and if it is determined that water is present in the at least one terminal, configuring the timer with a second time, which is different from the first time, by the processor.

In various embodiments, if the processor switches to an inactive state within the second time, the timer may be configured with the first time.

In various embodiments, the method may further include operations of: if it is determined that the water is present in the at least one terminal, determining whether or not the number of times the controller performs an operation of determining whether or not water is present in the at least one terminal is greater than or equal to a specified number of times by the processor; and if it is determined that the number of times the controller performs an operation of determining whether or not water is present in the at least one terminal is greater than or equal to the specified number of times, configuring the timer with a third time, which is different from the first time.

In various embodiments, the method may further include an operation of determining whether or not information to allow the electronic device to sense the dry state of at least one terminal included in a connection terminal is received from the controller by the processor, and the operation of determining whether or not the first time configured in the timer of the electronic device has elapsed and the operation of determining whether or not the information is received are performed in parallel.

In addition, the structure of the data used in the above-described embodiments may be recorded in the computer-readable recording medium by any of various methods. The computer-readable recording medium may include a storage medium such as a magnetic storage medium (e.g., a ROM, a floppy disk, a hard disk, etc.) or an optical reading medium (e.g., a CD-ROM, a DVD, etc.).

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a connection terminal comprising a terminal;
a controller configured to:
  determine a resistance value of the terminal;
  compare the determined resistance value to a specified first threshold value; and
  in response to comparing the determined resistance value to the specified first threshold value, transmit, to a processor, information related to the resistance value;
a capacitance checker comprising a sensing unit configured to determine capacitance of the terminal, and a switch configured to connect the terminal to the sensing unit based on a control signal received from the controller, wherein the sensing unit is configured to transmit the determined capacitance of the terminal to the processor; and
the processor configured to:
  compare the determined capacitance of the terminal to a specified second threshold value;
  determine whether or not the capacitance of the terminal is greater than or equal to the specified second threshold value;
  determine whether or not water is present in the terminal based on the information related to the resistance value received from the controller and the capacitance received from the capacitance checker by:
    based on the resistance value being less than or equal to the specified first threshold value and the capacitance being greater than or equal to the specified second threshold value, determining that water is present in the connection terminal;
    based on the resistance value exceeding the specified first threshold value and the capacitance being less than the specified second threshold value, determining that the connection terminal is in a dry state;
    based on the resistance value being less than or equal to the specified first threshold value and the capacitance being less than the specified second threshold value, determining that foreign matter is present in the connection terminal; and
    based on the resistance value exceeding the specified first threshold value and the capacitance being greater than or equal to the specified second threshold value, determining that a circuit of the electronic device has been damaged.

2. The electronic device of claim 1, wherein the controller is configured to:
determine whether or not the resistance value is less than or equal to the specified first threshold value;
based on determining that the resistance value is less than or equal to the specified first threshold value, transmit, to the processor, information related to the resistance value indicating that the resistance value is less than or equal to the specified first threshold value; and
based on determining that the resistance value exceeds the specified first threshold value, transmit, to the processor, information related to the resistance value indicating that the resistance value exceeds the specified first threshold value.

3. The electronic device of claim 1, wherein:
based on the electronic device performing an operation of sensing whether water is present in the connection terminal, the specified second threshold value is configured as a specified third threshold value, and
based on the electronic device performing an operation of sensing whether the connection terminal is in the dry state, the specified second threshold value is configured as a specified fourth threshold value, which is less than the specified third threshold value.

4. The electronic device of claim 1, further comprising a display device,
wherein the processor is configured to display information indicating that water is present in the connection terminal, information indicating that foreign matter is present in the connection terminal, or information indicating that a circuit of the electronic device has been damaged through the display device.

5. The electronic device of claim 1, wherein the sensing unit comprises a sensor configured to sense capacitance using a self-capacitance method.

6. The electronic device of claim 1, wherein the connection terminal is a universal serial bus (USB) connector.

7. An electronic device comprising:
a connection terminal comprising a terminal;
a capacitance checker comprising:
  a sensing unit configured to determine capacitance of the terminal; and
  a switch configured to connect the terminal to the sensing unit based on a control signal received from a controller,
  wherein the sensing unit is configured to transmit the determined capacitance of the terminal to the controller; and
the controller configured to:
  determine a resistance value of the terminal;
  compare the determined resistance value to a specified first threshold value;
  in response to comparing the determined resistance value to the specified first threshold value, generate information related to the resistance value;
  compare the determined capacitance of the terminal to a specified second threshold value;
  determine whether or not the capacitance of the terminal is greater than or equal to the specified second threshold value; and
  determine whether or not water is present in the terminal based on the information related to the resistance value and the capacitance received from the capacitance checker by:
    based on the resistance value being less than or equal to the specified first threshold value and the capacitance being greater than or equal to the specified second threshold value, determining that water is present in the connection terminal;
    based on the resistance value exceeding the specified first threshold value and the capacitance being less than the specified second threshold value, determining that the connection terminal is in a dry state;
    based on the resistance value being less than or equal to the specified first threshold value and the capacitance being less than the specified second threshold value, determining that foreign matter is present in the connection terminal; and
    based on the resistance value exceeding the specified first threshold value and the capacitance being greater than or equal to the specified second threshold value, determining that a circuit of the electronic device has been damaged.

8. The electronic device of claim 7, wherein the controller is configured to determine whether or not the resistance value is less than or equal to the specified first threshold value.

9. The electronic device of claim 8, wherein:
based on the electronic device performing an operation of sensing whether water is present in the connection terminal, the specified second threshold value is configured as a specified third threshold value, and
based on the electronic device performing an operation of sensing whether the connection terminal is in the dry state, the specified second threshold value is configured as a specified fourth threshold value, which is less than the specified third threshold value.

10. The electronic device of claim 7, further comprising a display device,
wherein the controller is configured to display information indicating that water is present in the connection terminal, information indicating that foreign matter is present in the connection terminal, or information indicating that a circuit of the electronic device has been damaged through the display device.

11. The electronic device of claim 7, wherein the controller comprises a processor configured to perform at least part of determining whether or not water is present in the terminal.

12. The electronic device of claim 7, wherein the connection terminal is a universal serial bus (USB) connector.

* * * * *